United States Patent
Lee et al.

(10) Patent No.: US 11,957,070 B2
(45) Date of Patent: Apr. 9, 2024

(54) SEMICONDUCTOR DEVICE, MEMORY CELL AND METHOD OF FORMING THE SAME

(71) Applicant: Taiwan Semiconductor Manufacturing Company, Ltd., Hsinchu (TW)

(72) Inventors: Tung-Ying Lee, Hsinchu (TW); Bo-Jiun Lin, Hsinchu County (TW); Shao-Ming Yu, Hsinchu County (TW); Yu-Chao Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 428 days.

(21) Appl. No.: 17/395,471

(22) Filed: Aug. 6, 2021

(65) Prior Publication Data
US 2023/0045290 A1    Feb. 9, 2023

(51) Int. Cl.
| | |
|---|---|
| *H10N 70/00* | (2023.01) |
| *H01L 23/528* | (2006.01) |
| *H10B 63/00* | (2023.01) |
| *H10N 70/20* | (2023.01) |

(52) U.S. Cl.
CPC ........ *H10N 70/826* (2023.02); *H01L 23/5283* (2013.01); *H10B 63/80* (2023.02); *H10N 70/061* (2023.02); *H10N 70/231* (2023.02); *H10N 70/841* (2023.02)

(58) Field of Classification Search
CPC ............... H10N 70/826; H10N 70/061; H01L 23/5283; H10B 63/80
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |

*Primary Examiner* — Marvin Payen
(74) *Attorney, Agent, or Firm* — JCIPRNET

(57) ABSTRACT

A memory cell includes a memory device, a connecting structure, an insulating layer and a selector. The connecting structure is disposed on and electrically connected to the memory device. The insulating layer covers the memory device and the connecting structure. The selector is located on and electrically connected to the memory device, where the selector is disposed on the insulating layer and connected to the connecting structure by penetrating through the insulating layer.

20 Claims, 13 Drawing Sheets

SEMICONDUCTOR DEVICE, MEMORY CELL AND METHOD OF FORMING THE SAME

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging. Semiconductor processing for fabrications of the semiconductor devices and ICs continues to evolve towards increasing device-density and higher numbers of semiconductor electronic components (e.g., transistors used for logic processing and memories used for storing information) of ever decreasing device dimensions. For example, the memories include non-volatile memory devices, where the non-volatile memory devices are capable of retaining data even after power is cut off. The non-volatile memory devices include resistive random-access memories and/or phase change random access memories.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
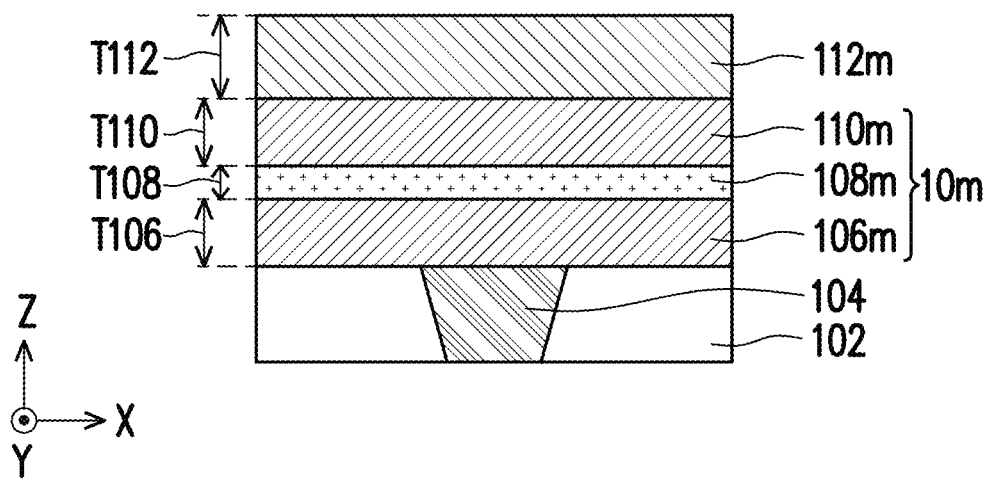
FIG. 1 through FIG. 8 are schematic cross-sectional views of a method of forming a memory cell in accordance with in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Embodiments discussed herein may be discussed in a specific context, namely a method of forming a memory cell which includes forming a selector on a memory element (or device). In a memory cell implemented with a selector (e.g., an ovonic threshold switch (OTS)), the selector is electrically connected to a corresponding memory element, so to control the corresponding memory element. Conventionally, the memory element is connected to the selector through a connecting structure having a conductive pillar. The conductive pillar disposed on the connecting structure is formed by a patterning process (such as an etching step) and a planarizing process (such as a polishing step). For example, the conductive pillar is formed by patterning a connecting material to form the connecting structure having conductive pillars disposed thereon, where the conductive pillar is further embedded in a dielectric layer. Thereafter, the dielectric layer is planarized until a top surface of the conductive pillars is exposed therefrom. The conductive pillar may be also likely planarized during the planarizing process. Then, the selector is sequentially formed on the exposed conductive pillar, thereby establishing a proper electrical connection between the selector and the memory element for implementation of the conventional memory cell with one selector and one memory element.

However, in the conventional methods, the patterning process includes an etching process. For example, during the etching process, the conductive pillar may be damaged by: (1) oxidation of the sidewall of the conductive pillar, (2) an etch damage, or (3) collapse of the conductive pillar due to small critical dimension such as a high aspect ratio (AR). Besides, the planarizing process includes a chemical mechanical polishing (CMP). For example, the conductive pillar may also be greatly damaged (such as a removal of the conductive pillar) via (1) a nature dishing behavior or (2) corrosion, under more polishing time during the CMP. And/or, the connection between the conductive pillar and the selector in the conventional selector may be greatly damaged via (3) an open between the conductive pillar and the selector due to the remained oxide on the conductive pillar, under less polishing time during the CMP. With above, the patterning process and the planarizing process have small processing window, thereby causing the difficulty in the manufacture and the device yield. With the conventional selector involving the use of the conductive pillar, the connection between the selector and the memory element is highly unsecured.

In accordance with some embodiments discussed herein, the connection between a selector and the memory element is securely arrived by direct contact the selector with the connecting structure without the conductive pillar therebetween. As such, the connection between the selector and the memory element in a memory cell of the disclosure is ensured, and the issues caused by the conventional conductive pillar can be resolved.

Figure 9:
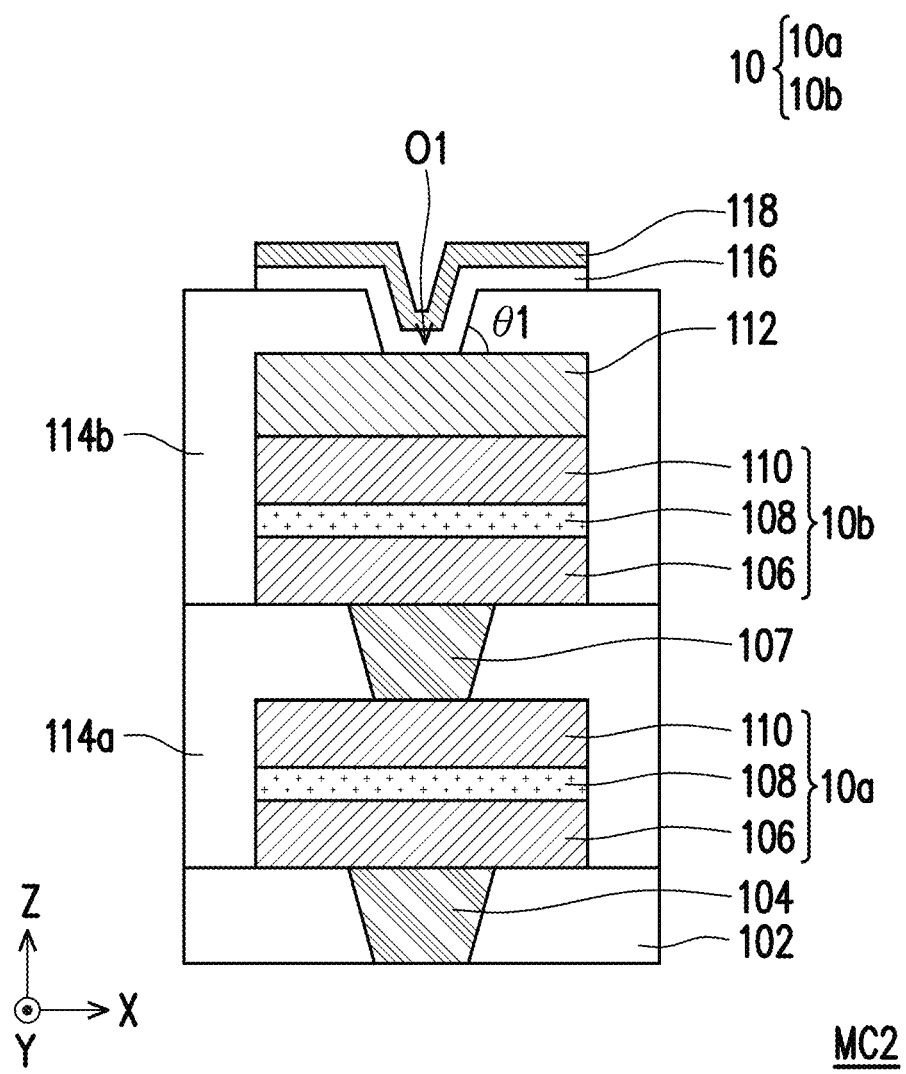
FIG. 9 is a cross-sectional view of a memory cell in accordance with some other embodiments of the disclosure.
Figure 10:
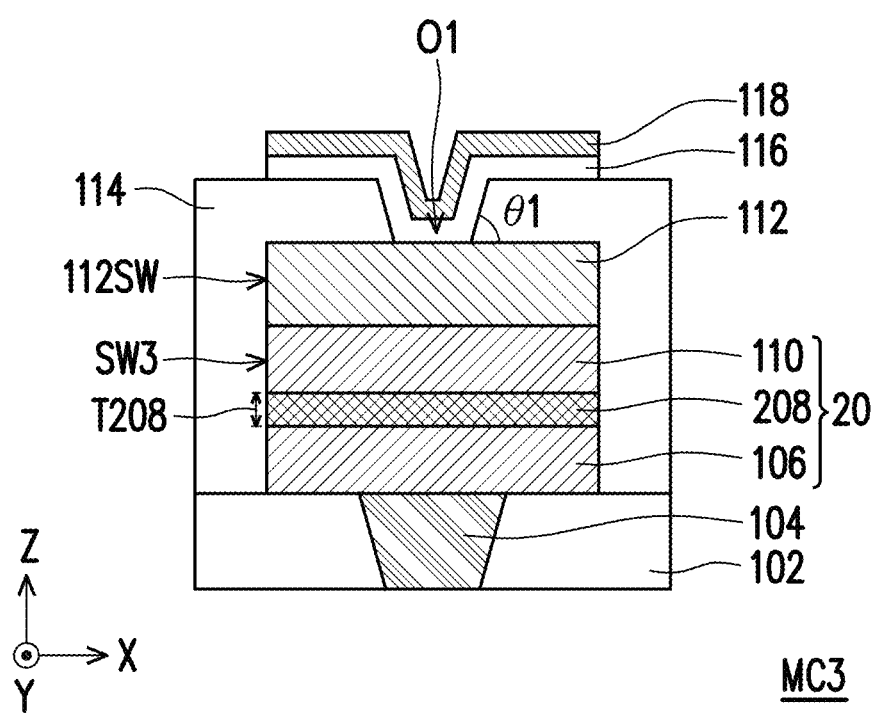
FIG. 10 is a cross-sectional view of a memory cell in accordance with some other embodiments of the disclosure.

FIG. 1 to FIG. 8 are cross-sectional views of a method of forming a memory cell in accordance with some embodiments of the disclosure. FIG. 9 is a cross-sectional view of a memory cell in accordance with some other embodiments of the disclosure. FIG. 10 is a cross-sectional view of a memory cell in accordance with some other embodiments of the disclosure. In some embodiments, the memory cell is applied to a resistive random-access memory (RRAM) cell, hereinafter referred to as a RRAM cell as illustrated in FIG. 1 through FIG. 8, FIG. 9 and FIG. 10. The RRAM cell may include one or more than one RRAM component or device.

Figure 8:
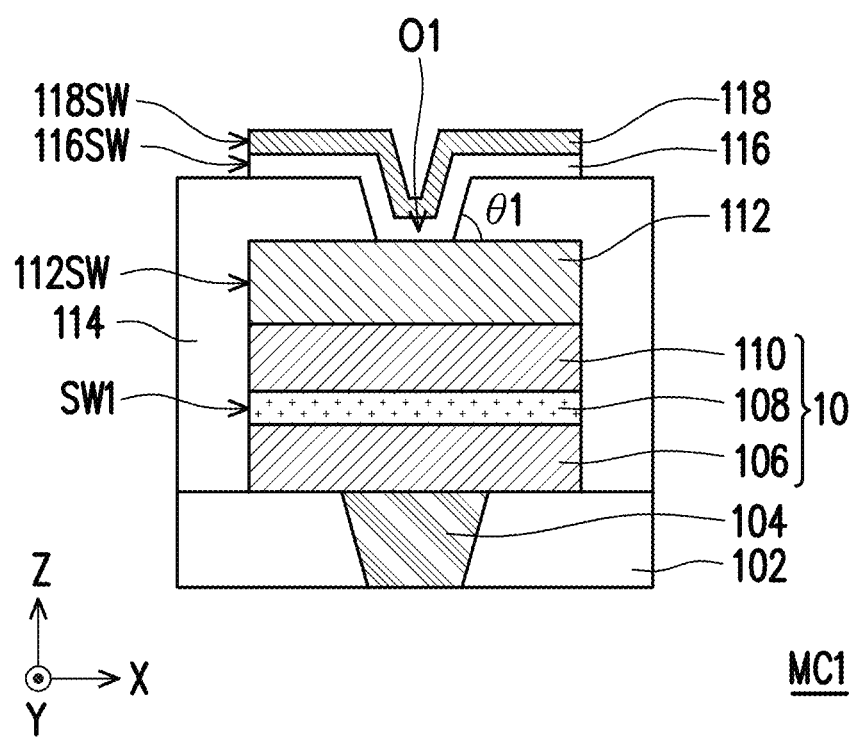

Referring to FIG. 1, a method of forming a memory cell MC1 (as shown in FIG. 8) includes following steps. First, an initial structure illustrated in FIG. 1 is provided. For example, the initial structure includes a dielectric layer 102, an electrode layer 104, a memory material stack 10$m$ and a connecting structure 112$m$.

In some embodiments, the electrode layer 104 is embedded in the dielectric layer 102. In some embodiments, the dielectric layer 102 includes a dielectric material, such as silicon oxide, silicon nitride, silicon oxynitride, silicon carbonitride, silicon carbide oxynitride, spin-on glass (SOG), phosphosilicate glass (PSG), borophosphosilicate glass (BPSG), fluosilicate glass (FSG), carbon doped silicon oxide (e.g., SiCOH), polyimide, a spin-on dielectric material, a low-k dielectric material, and/or a combination thereof. It should be noted that the low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof.

The dielectric layer 102 may be formed by chemical vapor deposition (CVD) (e.g., flowable chemical vapor deposition (FCVD), plasma-enhanced chemical vapor deposition (PECVD), high density plasma CVD (HDPCVD) or sub-atmospheric CVD (SACVD)), molecular layer deposition (MLD), spin-on coating, sputtering, or other suitable methods. In one embodiment, the dielectric layer 102 may be one-layer structure. In another embodiment, the dielectric layer 102 may be multi-layer structure. The disclosure is not limited thereto. In some embodiments, the dielectric layer 102 serves as an insulating layer, which is referred to as an inter-metal dielectric (IMD) layer.

In some embodiments, the electrode layer 104 is formed in the dielectric layer 102. In the case, as shown in FIG. 1, a surface of the electrode layer 104 is exposed from an illustrated top surface of the dielectric layer 102. In certain embodiments, the electrode layer 104 is formed by a single damascene process. For example, an opening (not labelled) is formed in and penetrates through the dielectric layer 102, and the opening is filled with a conductive material. In a subsequent step, a planarization process (e.g., a chemical-mechanical planarization (CMP) process) is performed to remove excessive conductive material, thereby forming the electrode layer 104. In certain embodiments, a top surface of the electrode layer 104 is substantially coplanar with the top surface of the dielectric layer 102 after the planarization process.

In some embodiments, the electrode layer 104 is referred to as a bottom electrode or a bottom electrode via (BEVA) that is electrically coupled to an overlying structure (e.g. coupled to a first electrode layer of a memory element formed in subsequent steps). The electrode layer 104 is configured to transmit the voltage applied to the electrode layer 104 to (a storage layer of) the memory element located thereon. The electrode layer 104 may be a single-layer structure (of one material) or a multilayer structure (of two or more different materials), and may be formed using CVD, atomic layer deposition (ALD), physical vapor deposition (PVD), a combination thereof, or the like. A material of the electrode layer 104 serving as the bottom electrode or the BEVA, for example, includes aluminum (Al), copper (Cu), tungsten (W), some other low resistance material, or a combination thereof. The electrode layer 104 may have a round, square, or rectangular profile in a top view (e.g. a X-Y plane).

In addition, a barrier layer (not shown) may be optionally formed between the electrode layer 104 and the dielectric layer 102. For example, the barrier layer is located at a sidewall of the electrode layer 104 to physically separate the electrode layer 104 and the electrode layer 102. In some embodiments, the barrier layer includes a material to prevent the electrode layer 104 from diffusing to the layers adjacent thereto. The material of the barrier layer may include Ti, Ta, TiN, TaN, or other suitable material, and may be formed using CVD, ALD, PVD, a combination thereof, or the like. Indeed, the barrier layer has the material different from that of the electrode layer 104. For example, the barrier layer includes TaN while the electrode layer 104 includes TiN.

Back to FIG. 1, in some embodiments, the memory material stack 10$m$ including a conductive material 106$m$, a storage element material 108$m$ and a conductive material 110$m$ is formed over the dielectric layer 102 and the electrode layer 104. In some embodiments, the conductive material 106$m$, the storage element material 108$m$ and the conductive material 110$m$ are sequentially formed along a direction Z. The direction Z is referred to as a stacking direction of the conductive material 106$m$, the storage element material 108$m$ and the conductive material 110$m$. In some embodiments, the conductive material 106$m$ is conformally formed on the dielectric layer 102 and the electrode layer 104. For example, the conductive material 106$m$ is located between the dielectric layer 102 and the storage element material 108$m$ and between the electrode layer 104 and the storage element material 108$m$ along the direction Z. In some embodiments, the conductive material 106$m$ is in physical contact with the electrode layer 104. That is, the conductive material 106$m$ is electrically connected to the electrode layer 104. The conductive material 106$m$ may include a conductive material, such as Ti, Co, Cu, AlCu, W, TiN, TiW, TiAl, TiAlN, TaN, Pt, or a combination thereof, and may be formed by any suitable method, such as CVD, PVD, or the like. In some embodiments, the conductive material 106$m$ has a thickness T106 of about 20 nm to about 50 nm.

In some embodiments, the storage element material 108$m$ is conformally formed on and is connected to the conductive material 106$m$. For example, the storage element material 108$m$ is in physical contact with the conductive material 106m. The storage element material 108m is located between the conductive materials 106m and 110m. The storage element material 108m may be formed by any suitable method, such as PVD, ALD, or the like. In some embodiments, the storage element material 108m includes a variable resistance dielectric material (also referred to as a resistance changeable material) used for the RRAM element or device. For example, the variable resistance dielectric material includes a transition metal oxide material, such as hafnium oxide (such as HfO or $HfO_2$, etc.), niobium oxide ($NbO_x$), lanthanum oxide ($LaO_x$), gadolinium oxide ($GdO_x$), vanadium oxide ($VO_x$), yttrium oxide ($YO_x$), zirconium oxide ($ZrO_x$), titanium oxide ($TiO_x$), tantalum oxide ($TaO_x$), nickel oxide ($NiO_x$), tungsten oxide ($WO_x$), chromium oxide ($CrO_x$), copper oxide ($CuO_x$), cobalt oxide ($CoO_x$) or iron oxide ($FeO_x$), and combination thereof. The storage element material 108m may have a thickness T108 of about 10 nm to about 30 nm.

In some embodiments, the conductive material 110m is conformally formed on the storage element material 108m. For example, the conductive material 110m is connected to the storage element material 108m. The conductive material 110m, for example, includes a conductive material, such as Ti, Co, Cu, AlCu, W, TiN, TiW, TiAl, TiAlN, TaN, Pt, or a combination thereof. In one embodiment, the materials of the conductive material 106m and the conductive material 110m are the same. For example, the conductive material 106m and the conductive material 110m both include TiN. In an alternative embodiment, the materials of the conductive material 106m and the conductive material 110m are different. The conductive material 110m may be formed by any suitable method, such as CVD, PVD, or the like. In some embodiments, the conductive material 110m has a thickness T110 of about 10 nm to about 50 m.

In some embodiments, the thickness T106 of the conductive material 106m is different from (e.g., less than or greater than) the thickness T110 of the conductive material 110m. However, the disclosure is not limited thereto; alternatively, the thickness T106 of the conductive material 106m may be substantially equal to the thickness T110 of the conductive material 110m.

In addition, an adhesive layer (not shown) is formed between the conductive material 110m and the storage element material 108m to enhance the adhesion between the conductive material 110m and the storage element material 108m. Owing to the adhesive layer, a delamination at the interface of the conductive material 110m and the storage element material 108m can be prevented. The adhesive layer may be made of a transition metal, such as Ti, Ni, Hf, Nb, La, Y, Gd, Zr, Co, Fe, Cu, V, Ta, W, Cr, and combinations thereof, and may be formed by CVD or the like. For example, the adhesive layer includes Ti while the conductive material 110m includes TiN. In the disclosure, the material of the adhesive layer may be selected based on the materials of the layers located underlying and overlying thereto. In some embodiments, the adhesive layer has a thickness of about 1 nm to about 3 nm. Alternatively, with the sufficient adhesion between the conductive material 110m and the storage element material 108m that is capable of preventing the delamination therebetween, the adhesive layer may be optional, the disclosure is not limited thereto.

Continued on FIG. 1, in some embodiments, the connecting material 112m is conformally formed on the conductive material 110m. For example, the connecting material 112m is in physical contact with the conductive material 110m. That is, the connecting material 112m is electrically connected to the conductive material 110m. The connecting material 112m, for example, includes a conductive material, such as W, Ti, Co, Cu, AlCu, TiN, TiW, TiAl, TiAlN, TaN, Pt, or a combination thereof. The connecting material 112m may be formed by any suitable method, such as CVD, PVD, or the like. In some embodiments, the connecting material 112m has a thickness T112 of about 10 nm to about 30 nm. In one embodiment, the material of the connecting material 112m is different from the material of the conductive material 106m and/or the material of the conductive material 110m. For example, the connecting material 112m includes W. In an alternative embodiment, the material of the connecting material 112m is the same as the materials of the conductive material 106m and/or the conductive material 110m. As shown in FIG. 1, the dielectric layer 102 and the electrode layer 104 are completely covered by the memory material stack 10m (including the conductive material 106m, the storage element material 108m and the conductive material 110m) and the connecting material 112m.

Figure 2:
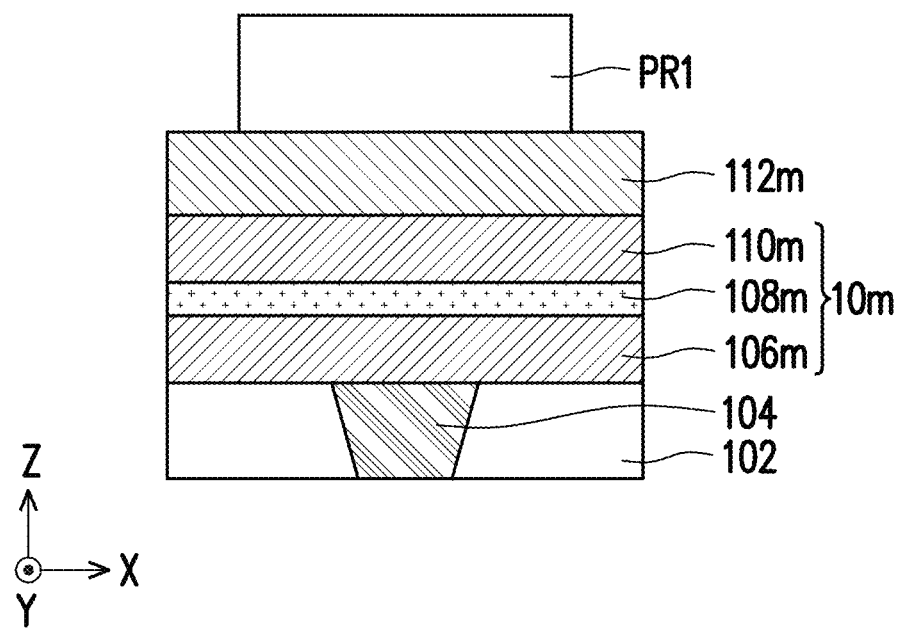

Referring to FIG. 2, in some embodiments, a photoresist pattern PR1 is formed on the connecting material 112m. The photoresist pattern PR1 may be located in an area correspond to the electrode layer 104 (e.g. a center position thereof). That is, the photoresist pattern PR1 is directly disposed on (e.g. stacked up) the electrode layer 104 in the direction Z, for example. In other words, a location of the photoresist pattern PR1 is overlapped with a location of the electrode layer 104 in a vertical projection on the X-Y plane along the direction Z. The photoresist pattern PR1 may have a round, square, or rectangular profile in the top view (e.g. the X-Y plane) depending on a desired shape of the later-formed memory element.

In one embodiment, the photoresist pattern PR1 may be formed by coating (such as spin-coating) and photolithography processes or the like; however, the disclosure is not limited thereto. A material of the photoresist pattern PR1, for example, includes a positive resist material or a negative resist material, that is suitable for a patterning process such as a photolithography process with a mask or a mask-less photolithography process (for instance, an electron-beam (e-beam) writing or an ion-beam writing). In the disclosure, the photoresist pattern PR1 is referred to as a photoresist layer or a resist layer. As shown in FIG. 2, for example, along a direction X and a direction Y (such as on the X-Y plane), a size of the photoresist pattern PR1 is greater than a size of the electrode layer 104. The direction X is different from the direction Y, and the directions X and Y are different from the direction Z. For example, the directions X and Y are normal to the direction Z, and the directions X and Y are perpendicular to each other.

Figure 3:
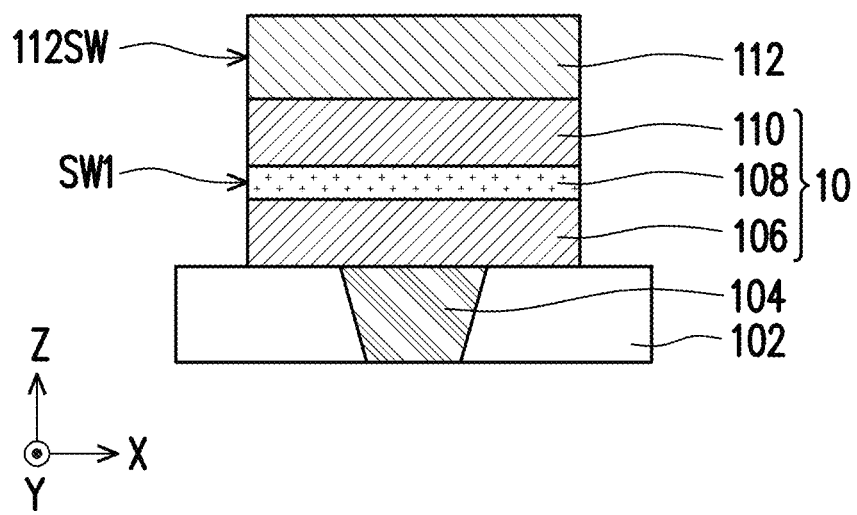

Referring to FIG. 2 and FIG. 3 together, in some embodiments, using the photoresist pattern PR1 as a mask, the connecting material 112m and the memory material stack 10m are patterned to form a connecting structure 112 and a memory element 10 including a conductive layer 110, a storage layer 108 and a conductive layer 106, respectively. For example, as shown in FIG. 3, the memory element 10 is a metal-insulator-metal (MIM) structure and is referred to as an RRAM device, where the conductive layer 106 is referred to as a bottom electrode of the RRAM device and the conductive layer 110 is referred to as a top electrode of the RRAM device.

In some embodiments, the conductive layer 106, the storage layer 108 and the conductive layer 110 each have a sidewall substantially aligned to each other in the direction Z. The sidewalls of the conductive layer 106, the storage layer 108 and the conductive layer 110 together constitute a sidewall SW1 of the memory element 10. As illustrated in FIG. 3, a sidewall 112SW of the connecting structure 112 is substantially aligned to the sidewall SW1 of the memory element 10.

In addition, the memory element 10 further includes the adhesive layer between the conductive layer 110 and the storage layer 108, where the adhesive layer is also patterned to have a sidewall substantially aligned with the sidewalls of the conductive layer 110, the storage layer 108 and the conductive layer 106. The details (e.g., the formation, material, thickness, configuration or the like) of the adhesive layer has been described in FIG. 1, and thus is not repeated herein for brevity. The memory element 10 is located between and electrically connected to the connecting structure 112 and the electrode layer 104 through the conductive layer 110 and the conductive layer 106, respectively, for example. In some embodiments, along the direction X and the direction Y (such as on the X-Y plane), a size of the memory element 10 and a size of the connecting structure 112 are substantially the same to each other, and are greater than the size of the electrode layer 104. For example, a portion of the dielectric layer 102 is exposed by the connecting structure 112 and the memory element 10.

However, the disclosure is not limited thereto. Alternatively, in the case of which the materials of the electrode layer 104 and the conductive layer 106 are the same, the electrode layer 104 and the conductive layer 106 may be an integrally formed and then together be referred to as the bottom electrode of the RRAM device. In further alternative embodiments, the conductive layer 106 is omitted, where the electrode layer 104 is referred to as the bottom electrode of the RRAM device, instead.

Generally, a RRAM element or device (e.g., the memory element 10) operates under the principle that a dielectric material/layer, which is normally insulating, can be made to conduct through a filament or conduction path formed after the application of a sufficiently high voltage. The conduction path formation can arise from different mechanisms, including but not limited to defect, metal migration, oxygen vacancy, etc. As described above, during a write operation to the memory element 10 of the memory cell MC1, a 'set' voltage is applied across the top and bottom electrodes to change the variable resistance dielectric material from a first resistivity (e.g., a high resistance state (HRS), where a filament or conduction path between the top and bottom electrodes are broken) to a second resistivity (e.g., a low resistance state (LRS), where the filament or conduction path between the top and bottom electrodes are established).

Similarly, a 'reset' voltage is applied across the top and bottom electrodes to change the variable resistance dielectric material from the second resistivity back to the first resistivity, for example, from LRS to HRS. Therefore, in instances where the LRS and HRS correspond to logic "1" and logic "0" states (or vice versa), respectively; the 'set' and 'reset' voltages can be used to store digital information bits in the RRAM cell (e.g. memory cell MC1 in FIG. 8) through the memory element 10 to provide relevant memory functions.

The connecting structure 112 and the memory element 10 may be formed on the dielectric layer 102 and the electrode layer 104 (e.g. BEVA) by, but not limited to, patterning the connecting material 112m using the photoresist pattern PR1 as the mask to form the connecting structure 112; patterning the conductive material 110m using the photoresist pattern PR1 (and the connecting structure 112) as the mask to form the conductive layer 110; patterning the adhesive layer using the photoresist pattern PR1 (along with the connecting structure 112 and the conductive layer 110) as the mask; patterning the storage element material 108m using the photoresist pattern PR1 (along with the connecting structure 112, the conductive layer 110 and the adhesive layer) as the mask to form the storage layer 108; patterning the conductive material 106m using the photoresist pattern PR1 (along with the connecting structure 112, the conductive layer 110, the adhesive layer and the storage layer 108) as the mask to form the conductive layer 106, thereby forming the memory element 10. The above patterning processes, for example, independently include an etching step, such as a dry etching, a wet etching or a combination thereof.

In some embodiments, the photoresist pattern PR1 is removed after the formation of the memory element 10 by acceptable ashing process and/or photoresist stripping process, such as using an oxygen plasma or the like. The disclosure is not limited thereto. For example, due to the use of the photoresist pattern PR1, the geometry of the connecting structure 112 is identical to the geometry of the memory element 10 in the cross section depicted in FIG. 3 and in the vertical projection on the X-Y plane along direction Z. That is, a sidewall 112SW of the connecting structure 112 is substantially aligned with the sidewall SW1 of the memory element 10.

Figure 4:
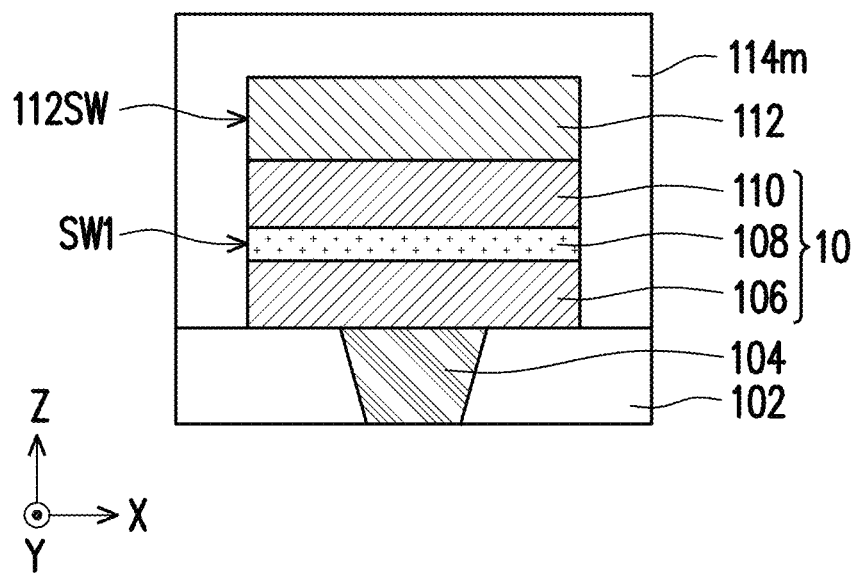

Referring to FIG. 4, in some embodiments, a dielectric material 114m is formed on the connecting structure 112. For example, the dielectric material 114m is formed on the portion of the dielectric layer 102 exposed by the memory element 10 and wraps the connecting structure 112 and the memory element 10. That is, the sidewall 112SW of the connecting structure 112 and the sidewall SW1 of the memory element 10 are in contact with the dielectric material 114m. In some embodiments, the dielectric material 114m includes a dielectric material, such as silicon oxide, silicon nitride, silicon oxynitride, silicon carbonitride, silicon carbide oxynitride, SOG, PSG, BPSG, FSG, carbon doped silicon oxide (e.g., SiCOH), polyimide, a spin-on dielectric material, a low-k dielectric material, and/or a combination thereof. It should be noted that the low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), HSQ or SiOF, and/or a combination thereof. The dielectric material 114m may be formed by any suitable method, such as CVD (e.g., FCVD, PECVD, HDPCVD or SACVD), MLD, spin-on coating, sputtering, or other suitable methods. For example, as shown in FIG. 4, the connecting structure 112 and the memory element 10 are embedded in the dielectric material 114m. In other words, the connecting structure 112 and the memory element 10 are not revealed.

Figure 5:
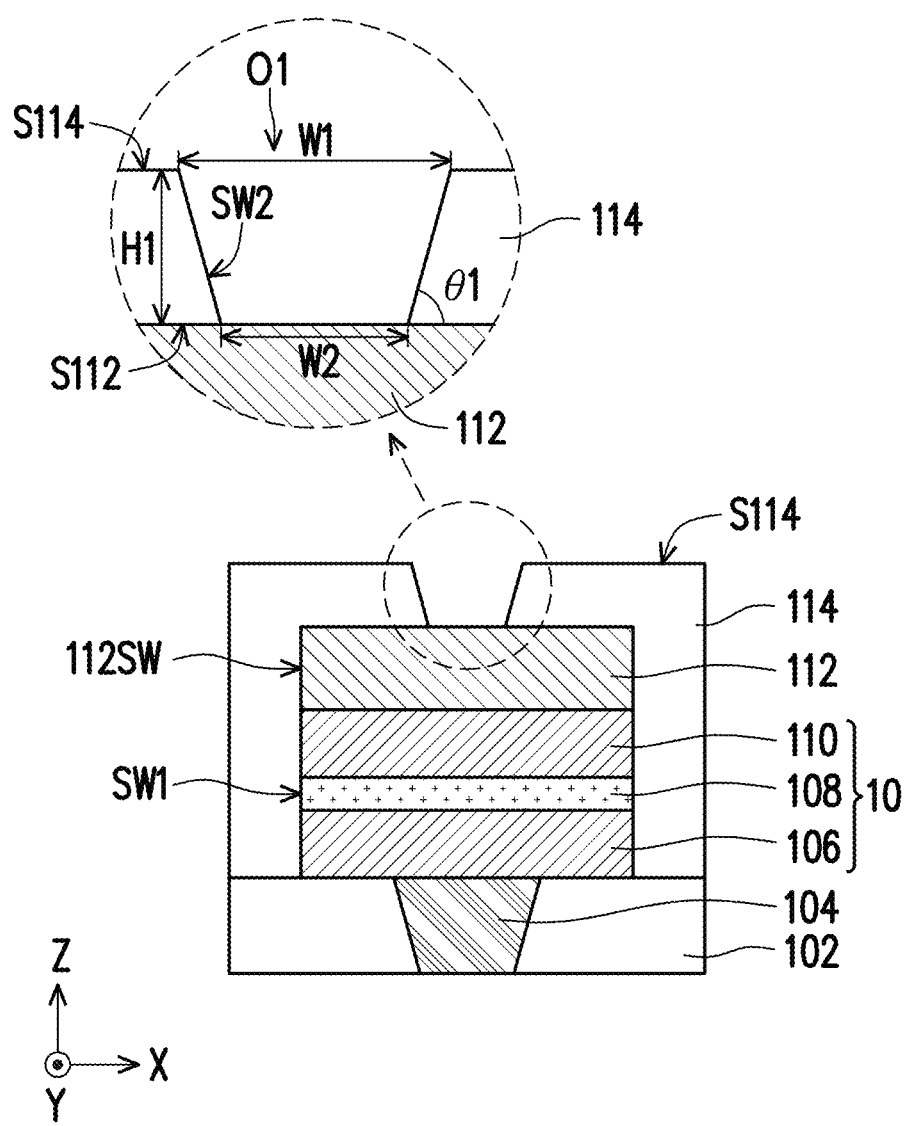

Referring to FIG. 5, in some embodiments, the dielectric material 114m is patterned to form a dielectric layer 114 having a recess (also referred to as a "via hole" or "trench") O1 exposing the connecting structure 112 underlying thereto. In some embodiments, the dielectric layer 114 serves as an insulating layer, which is referred to as an IMD layer. In some embodiments, a surface S112 of the connecting structure 112 is exposed by the recess O1 for electrically connecting to a later-formed element. The dielectric material 114m may be patterned by photolithography and/or etching processes. The etching process, for example, include a dry etching, a wet etching, or a combination thereof. During the formation of the recess O, the connecting structure 112 serves as an etching stop layer to protect the memory element 10 from damages caused by the etching process.

For example, along the direction X and the direction Y (such as on the X-Y plane), a size of the recess O1 is less than a size of the connecting structure 112. The location of the recess O1 is within the location of the connecting structure 112 in the vertical projection on the memory element 10 (e.g. the X-Y plane) in the direction Z. In some embodiments, a sidewall SW2 of the recess O1 is slant in reference with the direction Z, as shown in FIG. 5. The sidewall SW2 of the recess O1 and the surface S112 of the connecting structure 112 covered by (e.g. not exposed by) the dielectric layer 114 together confine an included angle θ1. For example, the included angle θ1 is approximately ranging from 30° to 75°.

As illustrated in FIG. 5, for example, the recess O1 has a top opening having a diameter W1 and a bottom opening having a diameter W2, and the diameter W1 is greater than the diameter W2. In some embodiments, the diameter W1 is approximately ranging from 10 nm to 50 nm, and the diameter W2 is approximately ranging from 5 nm to 30 nm. For example, in FIG. 5, for the recess O1, the top opening having the diameter W1 is located at a surface S114 of the dielectric layer 114 and the bottom opening having the diameter W2 is located at the surface S112 of the connecting structure 112. In some embodiments, the recess O1 has a height H1 approximately ranging from 10 nm to 30 nm.

Figure 6:
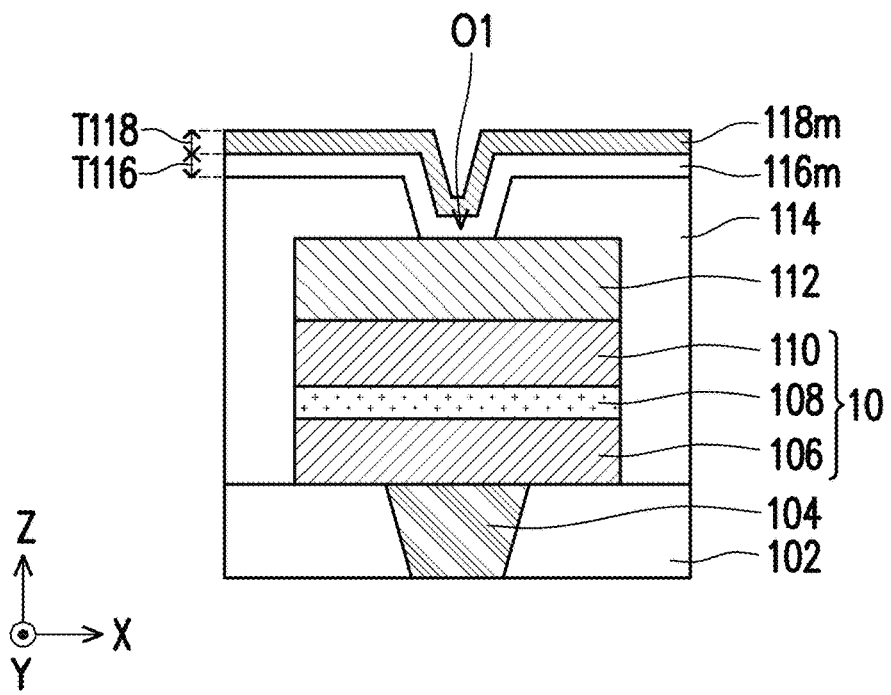

Referring to FIG. 6, in some embodiments, a selector material 116m and an electrode material 118m are sequentially and conformally formed on the connecting structure 112 and the dielectric layer 114, and are further extended into the recess O1. For example, the selector material 116m is located between the dielectric layer 114 and the electrode material 118m and between the connecting structure 112 and the electrode material 118m. That is, a portion of the selector material 116m is in contact with the connecting structure 112 through the recess O1 formed in the dielectric layer 114, where the sidewall SW2 of the recess O1 is covered by the selector material 116m. In other words, a surface of the selector material 116m is in contact with the dielectric layer 114 at the sidewall SW2 of the recess O1.

In some embodiments, a material of the selector material 116m includes an ovonic threshold switch (OTS) material. The OTS material is responsive to an applied voltage across an element (e.g., a selector 116 in FIG. 8) which is formed by the selector material 116m in a sequential step. For an applied voltage that is less than a threshold voltage, the selector (116 in FIG. 8) remains in an "off" state, e.g., an electrically nonconductive state. Alternatively, responsive to an applied voltage across the selector (116 in FIG. 8) that is greater than the threshold voltage, the selector (116 in FIG. 8) enters an "on" state, e.g., an electrically conductive state. That is, the selector (116 in FIG. 8) is referred to as a switch for determining to turn on or turn off the memory element 10.

In some embodiments, the OTS material of the selector material 116m is different from the transition metal oxide material of the storage element material 108m. The OTS material of the selector material 116m may include GeTe, GeCTe, AsGeSe, GeSbTe, GeSiAsTe, GeSe, GeSbSe, GeSiAsSe, GeS, GeSbS, GeSiAsS, or combinations thereof. Alternatively, the OTS material of the selector material 116m may include BTe, CTe, BCTe, CSiTe, BSiTe, BCSiTe, BTeN, CTeN, BCTeN, CSiTeN, BSiTeN, BCSiTeN, BTeO, CTeO, BCTeO, CSiTeO, BSiTeO, BCSiTeO, BTeON, CTeON, BCTeON, CSiTeON, BSiTeON, BCSiTeON, or combinations thereof. The selector material 116m may be formed by any suitable method, such as PVD, ALD, CVD, or the like. For example, the selector material 116m is formed by PVD. In some embodiments, the selector material 116m has a thickness T116 of about 5 nm to about 30 nm. The material of the selector material 116m is different from the material of the storage element material 108m, for example.

In some embodiments, the electrode material 118m is conformally formed on and in physical contact with the selector material 116m. The electrode material 118m, for example, includes a conductive material, such as Ti, Co, Cu, AlCu, W, TiN, TiW, TiAl, TiAlN, TaN, Pt, or a combination thereof. The electrode material 118m may be formed by any suitable method, such as CVD, PVD, or the like. In some embodiments, the electrode material 118m has a thickness T118 of about 5 nm to about 30 nm. In one embodiment, the material of the electrode material 118m is the same as the material of the connecting material 112m. For example, the electrode material 118m includes W. In an alternative embodiment, the material of the electrode material 118m is different from the material of the connecting material 112m. Alternatively, the material of the electrode material 118m may be the same as or different from the materials of the conductive material 106m and conductive material 110m.

Figure 7:
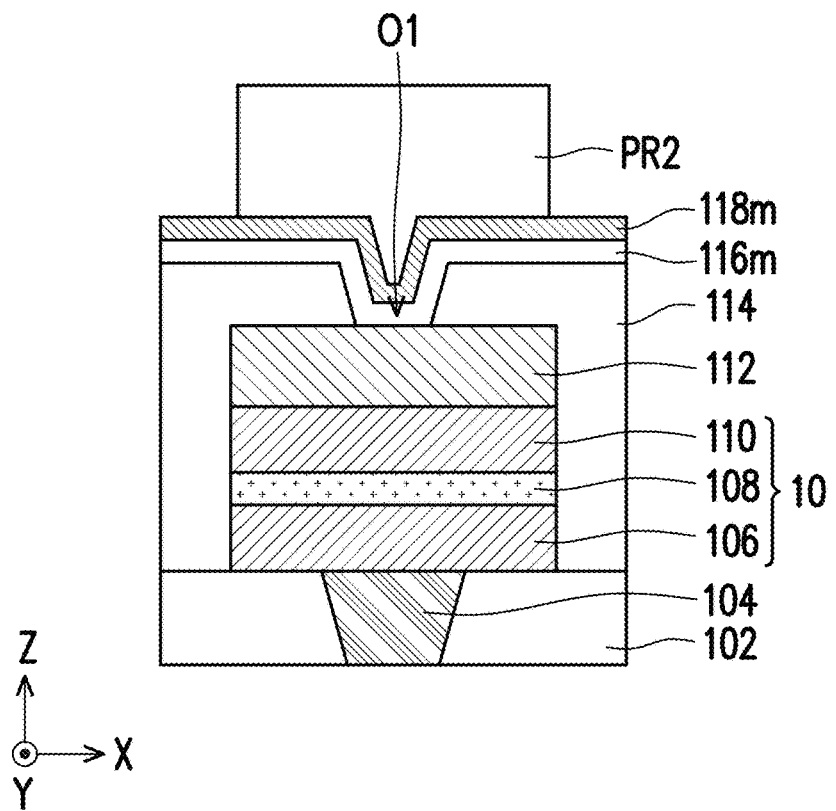

Referring to FIG. 7, in some embodiments, after the formations of the selector material 116m and the electrode material 118m, a photoresist pattern PR2 is formed on the electrode material 118m. The photoresist pattern PR2 may be located in an area correspond to the recess O1. For example, as shown in FIG. 6, the location of the recess O1 is within the location of the photoresist pattern PR2 in the vertical projection on the X-Y plane along the direction Z. That is, the photoresist pattern PR2 is directly covered on (e.g. stacked up) the recess O1. The material and formation of the photoresist pattern PR2 are identical or similar to the material and formation of the photoresist pattern PR1 as described in FIG. 2, thus are omitted herein for simplicity.

Referring to FIG. 7 and FIG. 8 together, in some embodiments, using the photoresist pattern PR2 as a mask, the electrode material 118m and the selector material 116m are patterned to form an electrode layer 118 and a selector 116, respectively; thereby forming the selector 116 that is connected to the memory element 10 through the connecting structure 112. Owing to the connecting structure 112, the adhesion between the selector 116 and the memory element 10 is enhanced; thereby suppressing a delamination between the selector 116 and the memory element 10. The patterning processes, for example, independently include an etching step, such as a dry etching, a wet etching or a combination thereof. In some embodiments, after the patterning, the photoresist pattern PR2 is removed by acceptable ashing process and/or photoresist stripping process, such as using an oxygen plasma or the like; however, the disclosure is not limited thereto. Up to here, the memory cell MC1 is manufactured, where in the memory cell MC1, the selector 116 is electrically coupled to the memory element 10. The electrode layer 118 is referred to as a top electrode that is electrically coupled to an underlying structure (e.g. the selector 116).

The memory element 10 is located between and electrically connected to the selector 116 and the electrode layer 104, where the selector 116 is located underneath and electrically connected to the electrode layer 118, as shown in FIG. 8, for example. That is, the memory element 10 is electrically coupled to the selector 116 in series. With such configuration, the voltage may be applied to the selector 116 for controlling the status (e.g. "on" or "off") of the memory element 10. While the memory element 10 is turned on, the voltages are further applied to the conductive layer 106 and the conductive layer 110 of the memory element 10 for operating the memory functions thereof (via HRS and LRS). The control mechanism of the selector 116 has been described in FIG. 6, the operating principle of the memory element 10 has been described in FIG. 3, and thus are omitted herein for simplicity.

In some embodiments, the geometry of the electrode layer 118 is identical to the geometry of the selector 116 in the cross section depicted in FIG. 8 and in the vertical projection on the X-Y plane along the direction Z. That is, the selector 116 and the electrode layer 118 each have a sidewall (e.g., 116SW, 118SW in FIG. 8) substantially aligned to each other along the direction Z. For example, on the X-Y plane, a size of the electrode layer 118 is substantially the same as a size of the selector 116. In some embodiments, a portion of the dielectric layer 114 is exposed by the selector 116.

In one embodiment, the sidewall 116SW of the selector 116 and the sidewall 118SW of the electrode layer 118 are substantially aligned with the sidewall 112SW of the connecting structure 112 in the direction Z. That is, the sidewall 116SW of the selector 116 and the sidewall 118SW of the electrode layer 118 are also substantially aligned with the sidewall SW1 of the memory element 10.

However, the disclosure is not limited thereto; alternatively, the sidewall 116SW of the selector 116 and the sidewall 118SW of the electrode layer 118 may be offset from the sidewall 112SW of the connecting structure 112 in the direction Z. That is, the sidewall 116SW of the selector 116 and the sidewall 118SW of the electrode layer 118 may also be offset from the sidewall SW1 of the memory element 10.

In some embodiments, the selector 116 is located between and in contact with the connecting structure 112 and the electrode layer 118, where the selector 116 directly connects to the connecting structure 112 through the recess O1 formed in the dielectric layer 114. As illustrated in the cross section of FIG. 8, for example, the recess O1 formed in the dielectric layer 114 is formed in the shape of a trapezoid, where the diameter W1 of the top opening of the recess O1 is greater than the diameter W2 of the bottom opening of the recess O1. That is, owing to the recess O1, a profile of the cross section of the selector 116 inside the recess O1 is in a form of V-shape, as shown in FIG. 8. In other words, the included angle θ1 is between the selector 116 lied at the sidewall SW2 of the recess O1 and the connecting structure 112 covered by the dielectric layer 114. For example, the included angle θ1 is approximately ranging from 30° to 75°.

On the other hand, owing to the recess O1 and the V-shaped selector 116 located therein, a profile of the cross section of the electrode layer 118 inside the recess O1 is also in a form of V-shape, as shown in FIG. 8. Due to the selector 116 (e.g., its forming method and resulting structure) is physically connected to the connecting structure 112 being directly stacked on and electrically coupled to the memory element 10, there is no conductive pillar between the selector 116 and the connecting structure 112; thereby greatly ensuring and securing the connection between the selector 116 and the memory element 10. Consequentially, due to the selector 116 (e.g. the omittance of the conductive pillar between the selector 116 and the connecting structure 112), the processing window of forming the memory cell MC1 is increased, thereby improving the manufacturing yield of the memory cell MC1 (e.g. the RRAM cell). In addition, owing to the selector 116 (e.g., its forming method and resulting structure), the manufacture of the memory cell MC1 requests a low thermal budget as compared to the conventional method, and thus the reliability of the memory cell MC1 is ensured.

In the disclosure, the connecting structure 112 is employed to electrically connect to the memory element 10 (e.g. the conductive layer 110) and the selector 116. The electrode layer 118 (e.g. acting as the top electrode of the RRAM cell, e.g. MC1) connected to the selector 116 is employed to electrically connect to a conductive connector overlying thereto (e.g. a conductive trace/line/wire or a conductive via of an interconnect). The electrode layer 104 (e.g. acting as the bottom electrode of the RRAM cell, e.g. MC1) connected to the memory element 10 (e.g. the conductive layer 106) is employed to electrically connect to a conductive connector underlying thereto (e.g. a conductive trace/line/wire or a conductive via of an interconnect).

Figure 18:
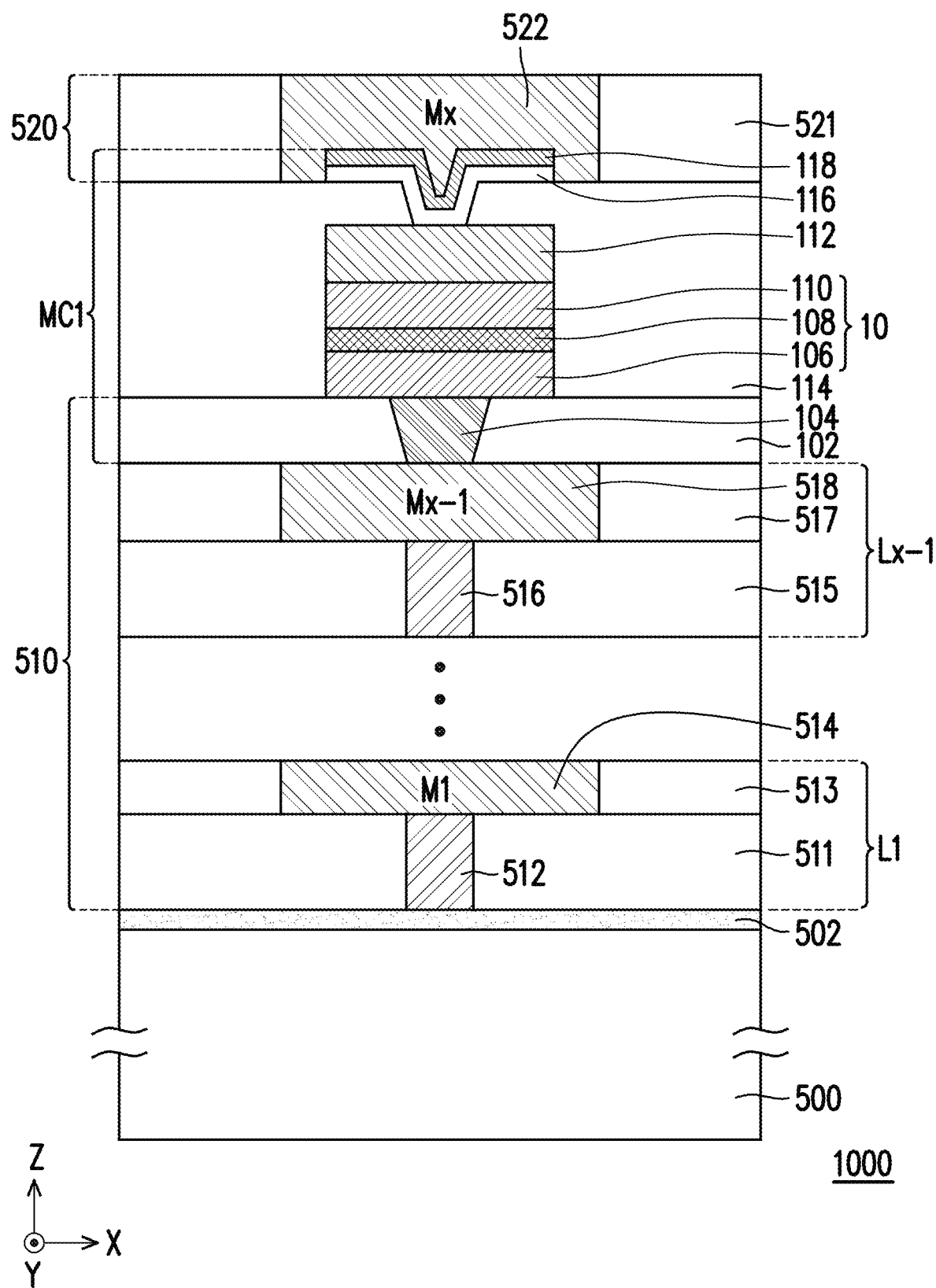
FIG. 18 is a cross-sectional view of a semiconductor device having a memory cell in accordance with some embodiments of the disclosure.

Back to FIG. 8, in some embodiments, the memory cell MC1 has one selector 116 and one memory element 10, that are electrically connected to each other and located between the overlying conductive connector (e.g. 522 in FIG. 18) and the underlying conductive connector (e.g. 518 in FIG. 18). That is to say, the memory cell MC1 is implemented as a 1-selector-1-memory (1S1M) configuration. However, the disclosure is not limited thereto; alternatively, the memory cell may include one selector 116 and a plurality of memory elements 10 electrically connected to the selector 116. In other words, the memory cell of the disclosure may be implemented as a 1S2M configuration (e.g., the memory cell MC2 in FIG. 9), a 1S3M configuration, a 1S4M configuration, a 1S5M configuration, . . . , a 1SnM configuration, etc. It is appreciated that; n is a positive integer. In some other embodiments, the memory cell MC1 is implemented as a 1-selector-1-transitor-1-resistor (1S1T1R) configuration.

In some embodiments of which the memory cell MC2 has the 1S2M configuration as shown in FIG. 9, the memory cell MC2 includes one selector 116 and two memory elements 10 (e.g. 10*a* and 10*b*). The memory cell MC2 illustrated in FIG. 9 is similar to the memory cell MC1 illustrated in FIG. 8. Therefore, the same reference numerals are used to refer to the same or liked parts, and its detailed description will be omitted herein.

As illustrated in FIG. 9, in some embodiments, the memory element 10*a* and the memory element 10*b* each include an electrode layer 106, a conductive layer 110 and a storage layer 108 located therebetween. The formations and materials of the memory element 10*a* and the memory element 10*b* independently are the same as or similar to the formation and material of the memory element 10 as described in FIG. 1 through FIG. 3, and the detail (e.g., the formation, material, thickness, configuration or the like) of the selector 116 has been described in FIG. 6 through FIG. 8; thus, are not repeated herein for simplicity. The selector 116 is electrically connected to the memory element 10*a* and the memory element 10*b*. For example, the selector 116, the memory element 10*a* and the memory element 10*b* are electrically coupled to each other in series, as shown in FIG. 9. Owing to the configuration, the memory elements 10*a* and 10*b* are simultaneously controlled by the selector 116.

However, the disclosure is not limited thereto. Alternatively, the selector 116 may be electrically coupled to the memory element 10*a* and the memory element 10*b* in series, respectively. That is, the memory element 10*a* and the memory element 10*b* may be electrically coupled to each other in parallel.

In some embodiments, the memory element 10*a* is located between an electrode layer 104 and the memory element 10*b* along the direction Z, where the electrode layer 104 is at least laterally wrapped by the dielectric layer 102. The memory element 10a is further wrapped by a dielectric layer 114a. For example, as shown in FIG. 9, the dielectric layer 114a includes a recess (not labelled) exposing at least a part of the memory element 10a, where an electrode layer 107 is formed in the recess to electrically connect the memory element 10a (e.g. the conductive layer 110) and the memory element 10b (e.g. the conductive layer 106). The details (e.g., the formation, material, thickness, configuration or the like) of the dielectric layer 102 and the electrode layer 104 have been described in FIG. 1, the formation and material of the dielectric layer 114a are the same or similar to the formation and material of the dielectric layer 114 as described in FIG. 4 through FIG. 5, and the formation and material of the electrode layer 107 are the same or similar to the formation and material of the electrode layer 104 as described in FIG. 1, and thus are not repeated herein.

In some embodiments, the memory element 10b is located between the memory element 10a and the selector 116 along the direction Z, where the electrode layer 107 is sandwiched between the memory elements 10a and 10b, and the connecting structure 112 is located between the memory element 10b and the selector 106. Through physical contacts between the electrode layer 107 and the memory element 10a and between the electrode layer 107 and the memory element 10b, a proper electrical connection between the memory elements 10a and 10b is established. Through physical contacts between the connecting structure 112 and the memory element 10b and between the connecting structure 112 and the selector 116, a proper electrical connection between the memory element 10b and the selector 116 is established. Alternatively, the electrode layer 107 may be omitted, where the memory element 10b may be electrically connected to the memory element 10b by direct contact between the memory elements 10a and 10b. With such embodiments, one of the conductive layer 110 of the memory element 10a and the conductive layer 106 of the memory element 10b may be further omitted, and the other one may be, simultaneously, served as the top electrode of the memory element 10a and the bottom electrode of the memory element 10b.

In some embodiments, the memory element 10b and the connecting structure 112 are further wrapped by a dielectric layer 114b. For example, as shown in FIG. 9, the dielectric layer 114b includes a recess O1 exposing at least a part of the connecting structure 112, where the selector 116 and the electrode layer 118 are formed on the dielectric layer 114b and further extend into the recess O1 for connecting the connecting structure 112. The formation and material of the dielectric layer 114b are the same or similar to the formation and material of the dielectric layer 114 as described in FIG. 4 through FIG. 5, and thus are not repeated herein.

Owing to the selector 116 (e.g., its forming method and resulting structure (e.g. the included angle θ1 and the V-shape profile in the cross-section)), the connection between the selector 116 and the connecting structure 112 is greatly ensured and secured by direct contact, and no conductive pillar is between the selector 116 and the connecting structure 112. As shown in FIG. 9, in some embodiments, the electrode layer 118 has the V-shape profile in the cross-section. Due to the selector 116 (e.g. the omittance of the conductive pillar between the selector 116 and the connecting structure 112), the processing window of forming the memory cell MC2 is increased, thereby improving the manufacturing yield of the memory cell MC2 (e.g. the RRAM cell). Owing to the selector 116 (e.g., its forming method and resulting structure), a low thermal budget is requested, and thus the reliability of the memory cell MC2 is ensured.

Embodiments are not limited to a particular storage element material or materials associated with the storage element or device (e.g. RRAM) of the memory cell MC1 as depicted in FIG. 8 and the memory cell MC2 as depicted in FIG. 9. For example, the memory cell is applied to a phase change random access memory (PCRAM) cell, hereinafter referred to as a PCM cell (FIG. 10). The PCM cell may include one or more than one PCRAM element or device. Alternatively, the memory cell may be applied to a memory cell including both of a RRAM element and a PCRAM element electrically connected thereto (not shown), hereinafter referred to as a RRAM/PCM cell (not shown). The RRAM/PCM cell may include one or more than one RRAM element or device and one or more than one PCRAM element or device. However, the disclosure is not limited thereto, the material of the storage layer included in a memory cell may be substituted with a suitable material used for a magnetoresistive random access memory (MRAM) cell, a ferroelectric random-access memory (FeRAM) cell, or a combination thereof. That is, the storage layer included in the memory cell may include variable resistance dielectric materials, phase change materials, binary metal oxide materials, and/or colossal magnetoresistive materials, or the like. The material of the storage layer can be selected and designed based on the type of the memory elements included in the memory cell, the disclosure is not limited thereto.

FIG. 10 is a cross-sectional view of a memory cell in accordance with some other embodiments of the disclosure. The arrangement and material of the memory cell MC3 are similar to the arrangement and material of the memory cell MC1, and thus details thereof are omitted herein. A main difference between the memory cell MC3 depicted in FIG. 10 and the memory cell MC1 depicted in FIG. 8 lies in that the memory cell MC3 has a memory element 20 instead of the memory element 10. In some embodiments, the memory element 20 includes a conductive layer 106, a conductive layer 110 located on the conductive layer 106, and a storage layer 208 located between the conductive layer 106 and the conductive layer 110. The details (e.g., the formation, material, thickness, configuration or the like) of the conductive layer 106 and the conductive layer 110 have been described in FIG. 1 through FIG. 3, and thus are not repeated herein for brevity.

The storage layer 208 may include a phase change material. For example, the phase change material includes a chalcogenide material, such as an indium (In)-antimony (Sb)-tellurium (Te) (IST) material or a germanium (Ge)-antimony (Sb)-tellurium (Te) (GST) material. The ISG material may include $In_2Sb_2Te_5$, $In_1Sb_2Te_4$, $In_1Sb_4Te_7$, or the like. The GST material may include $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. Other phase change materials may include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. The material of the storage layer 208 is different from the material of the selector 116, for example. However, the formation of the storage layer 208 is the same or similar to the formation of the storage layer 108 as described in FIG. 1 through FIG. 3, and thus is omitted herein. The storage element material 208m may have a thickness T208 of about 2 nm to about 30 nm.

Due to the storage layer 208 includes the phase change material, the storage layer 208 has a variable phase representing a data bit. For example, the storage layer 208 has a crystalline phase and an amorphous phase which are interchangeable. The crystalline phase and the amorphous phase may respectively represent a binary "1" and a binary "0", or vice versa. Accordingly, the storage layer 208 has a variable resistance that changes with the variable phase of the storage layer 208. For example, the storage layer 208 has a high resistance in the amorphous phase and a low resistance in the crystalline phase.

In the operation of the memory cell MC3, the data state of the memory cell MC3 is read by measuring the resistance of the memory cell MC3 (i.e., the resistance from the conductive layer 106 (e.g. serving as the bottom electrode) to the conductive layer 110 (e.g. serving as the top electrode)). The phase of the storage layer 208 represents the data state of the memory cell MC3, the resistance of the storage layer 208, or the resistance of the memory cell MC3. Further, the data state of the memory cell MC3 may be set and reset by changing the phase of the storage layer 208.

In some embodiments, the phase of the storage layer 208 is changed by heating. For example, the conductive layer 106 (or the conductive layer 110) heats the storage layer 208 to a first temperature that induces crystallization of the storage layer 208, so as to change the storage layer 208 to the crystalline phase (e.g., to set the memory cell MC3). Similarly, the conductive layer 106 (or the conductive layer 110) heats the storage layer 208 to a second temperature that melts the storage layer 208, so as to change the storage layer 208 to the amorphous phase (e.g., to reset the memory cell MC3). The first temperature is lower than the second temperature. In some embodiments, the first temperature is 100° C. to 200° C. and the second temperature is 500° C. to 800° C. In the disclosure, for the memory cell MC3, the conductive layer 106 (or the conductive layer 110) may be referred to as a heater, or the electrode layer 104 and the conductive layer 106 may be together referred to as the heater.

The amount of heat generated by the conductive layer 106 (or the conductive layer 110) varies in proportion to the current applied to the conductive layer 106 (or the conductive layer 110). That is, the storage layer 208 is heated up to a temperature (i.e., the second temperature) higher than the melting temperature when a current passes through it. The temperature is then quickly dropped below the crystallization temperature. In the case, a portion of the storage layer 208 is changed to the amorphous state with high resistivity, and thus the state of the memory cell MC3 is changed to a high resistance state. Then, the portion of the storage layer 208 may be reset back to the crystalline state by heating up the storage layer 208 to a temperature (i.e., the first temperature) higher than the crystallization temperature and lower than the melting temperature, for a certain period.

In some embodiments, the selector 116 is formed on and electrically coupled to the memory element 20 through the connecting structure 112. As illustrated in FIG. 10, for example, the selector 116 is electrically coupled to the memory element 20 in series. With such configuration, the memory element 20 is controlled by the selector 116, where the voltage may be applied to the selector 116 for controlling the status (e.g. "on" or "off") of the memory element 20. The control mechanism of the selector 116 has been described in FIG. 6, and thus are omitted herein for simplicity. While the memory element 20 is turned on, the current is applied to the memory element 20 for operating the memory functions thereof (via phase changes in the crystalline). Owing to the selector 116 (e.g., its forming method and resulting structure (e.g. the included angle θ1 and the V-shape profile in the cross-section)), the connection between the selector 116 and the connecting structure 112 is greatly ensured and secured by direct contact, and there is no conductive pillar between the selector 116 and the connecting structure 112. Consequentially, due to the selector 116 (e.g. the omittance of the conductive pillar between the selector 116 and the connecting structure 112), the processing window of forming the memory cell MC3 is increased, thereby improving the manufacturing yield of the memory cell MC3 (e.g. the PCM cell). Owing to the selector 116 (e.g., its forming method and resulting structure), a low thermal budget is requested, and thus the reliability of the memory cell MC3 is ensured.

As shown in FIG. 10, a sidewall 112SW of the connecting structure 112 is substantially aligned with a sidewall SW3 of the memory element 20 in the direction Z, in some embodiments. The sidewall SW3 is constituted by a sidewall of the conductive layer 106, a sidewall of the storage layer 208 and a sidewall of the conductive layer 110, for example.

In addition, the memory element 20 may substitute at least one of the memory elements 10a and 10b included in the memory cell MC2 depicted in FIG. 9.

FIG. 11 through FIG. 15 are schematic cross-sectional views of a method of forming a memory cell in accordance with in accordance with some embodiments of the disclosure. FIG. 16 is a cross-sectional view of a memory cell in accordance with some other embodiments of the disclosure. The elements similar to or substantially the same as the elements described previously will use the same reference numbers, and certain details or descriptions (e.g. formation methods, materials, and so on) of the same elements may not be repeated herein.

Figure 11:
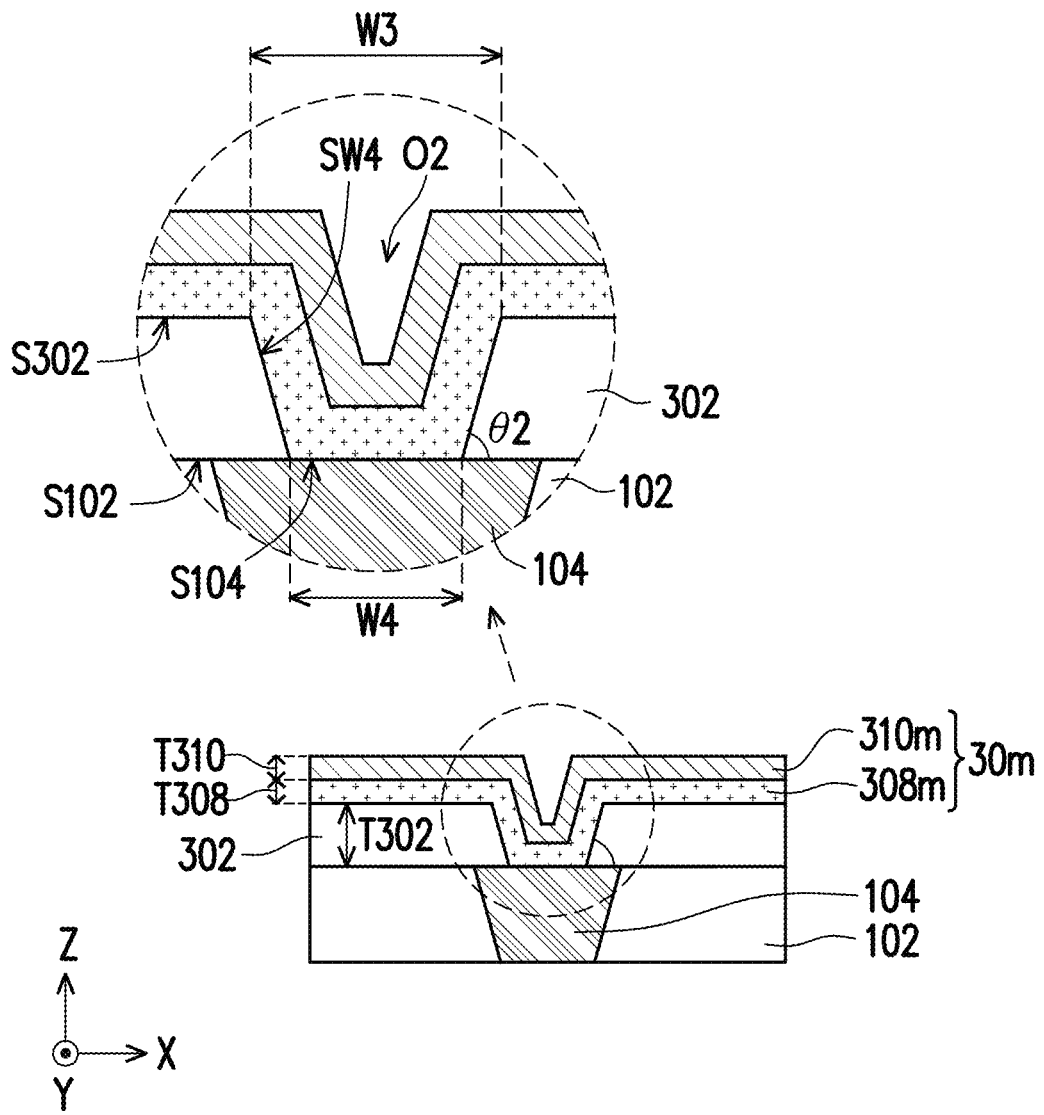
FIG. 11 through FIG. 15 are schematic cross-sectional views of a method of forming a memory cell in accordance with in accordance with some embodiments of the disclosure.

Referring to FIG. 11, in some embodiments, a dielectric layer 102 having an electrode layer 104 embedded therein is provided. In some embodiments, the electrode layer 104 is formed in the dielectric layer 102, where a surface of the electrode layer 104 is exposed from an illustrated top surface of the dielectric layer 102. The details (e.g., the formation, material, thickness, configuration or the like) of the dielectric layer 102 and the electrode layer 104 have been described in FIG. 1, and thus are not repeated herein.

In some embodiments, a dielectric layer 302 is formed on the dielectric layer 102, and has a recess (also referred to as a "via hole" or "trench") O2 exposing at least a portion of the electrode layer 104. The formation and material of the dielectric layer 302 are the same as or similar to the formation and material of the dielectric layer 114 as described in FIG. 4 through FIG. 5, and thus are not repeated herein. In some embodiments, the dielectric layer 302 has a thickness T302 of about 20 nm to about 50 nm. In some embodiments, the dielectric layer 302 serves as an insulating layer, which is referred to as an IMD layer. In some embodiments, a sidewall SW4 of the recess O2 is slant in reference with the direction Z, as shown in FIG. 11. The sidewall SW4 of the recess O2 and a surface S104 of the electrode layer 104 or a surface S102 of the dielectric layer 102 covered by (e.g. not exposed by) the dielectric layer 302 together confine an included angle θ2. For example, the included angle θ2 is approximately ranging from 30° to 75°.

In some embodiments, the recess O2 has a top opening having a diameter W3 and a bottom opening having a diameter W4, and the diameter W3 is greater than the diameter W4. In some embodiments, the diameter W3 is approximately ranging from 10 nm to 50 nm, and the diameter W4 is approximately ranging from 5 nm to 30 nm. For example, in FIG. 11, for the recess O2, the top opening having the diameter W3 is located at a surface S302 of the dielectric layer 302 and the bottom opening having the diameter W4 is located at the surface S104 of the electrode layer 104. In some embodiments, the recess O2 has a height H2 approximately ranging from 10 nm to 50 nm. As illustrated in the cross section of FIG. 11, for example, the recess O2 formed in the dielectric layer 302 is formed in the shape of a trapezoid.

Continued on FIG. 11, in some embodiments, a storage element material 308m and a conductive material 310m are sequentially and conformally formed over the dielectric layer 302 and the electrode layer 104. For example, the storage element material 308m extends into the recess O2 and is in contact with the electrode layer 104. The conductive material 310m is stacked atop of the storage element material 308m. In some embodiments, the storage element material 308m is located between the electrode layer 104 and the conductive material 310m and between the dielectric layer 302 and the conductive material 310m along the direction Z. The formation and material of the storage element material 308m are the same as or similar to the formation and material of the storage element material 108m as described in FIG. 1, and the formation and material of the conductive material 310m are the same as or similar to the formation and material of the connecting material 112m, and thus are not repeated herein. The storage element material 308m may have a thickness T308 of about 10 nm to about 30 nm. The conductive material 310m may have a thickness T310 of about 20 nm to about 50 nm. For example, the conductive material 310m includes W.

In addition, an adhesive layer (not shown) is formed between the conductive material 310m and the storage element material 308m to enhance the adhesion between the conductive material 310m and the storage element material 308m. Owing to the adhesive layer, a delamination at the interface of the conductive material 310m and the storage element material 308m can be prevented. The details (e.g., the formation, material, thickness, configuration or the like) of the adhesive layer have been described in FIG. 1, and thus are omitted. With the sufficient adhesion between the conductive material 310m and the storage element material 308m that is capable of preventing the delamination therebetween, the adhesive layer may be optional.

Figure 12:
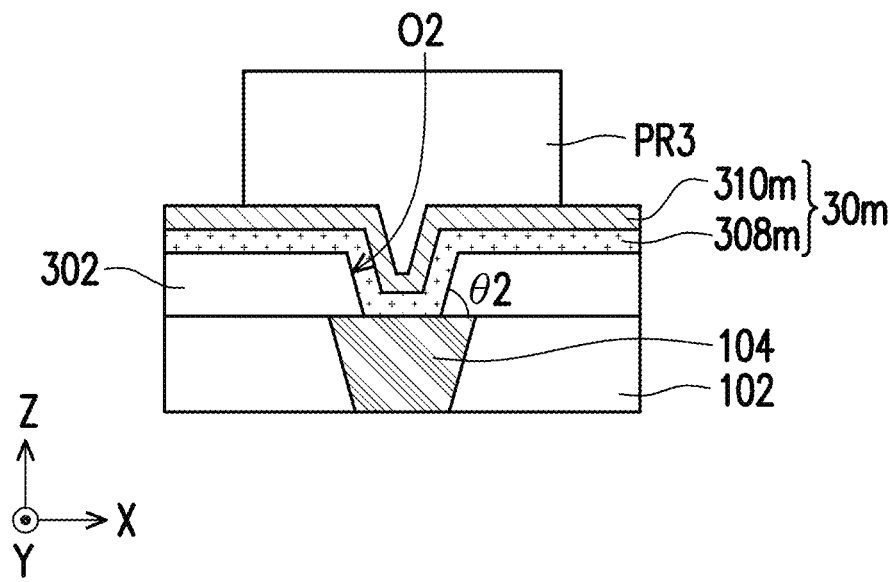

Referring to FIG. 12, in some embodiments, a photoresist pattern PR3 is formed on the conductive material 310m. The photoresist pattern PR3 may be located at an area correspond to the recess O2 (e.g. a center position thereof). For example, as shown in FIG. 12, the location of the recess O2 is within the location of the photoresist pattern PR3 in the vertical projection on the X-Y plane along the direction Z. That is, the photoresist pattern PR3 is directly covered on the conductive material 310m and the storage element material 308m being located in the recess O2. The material and formation of the photoresist pattern PR3 are identical or similar to the material and formation of the photoresist patterns PR1 and/or PR2, thus are omitted herein for simplicity.

Figure 13:
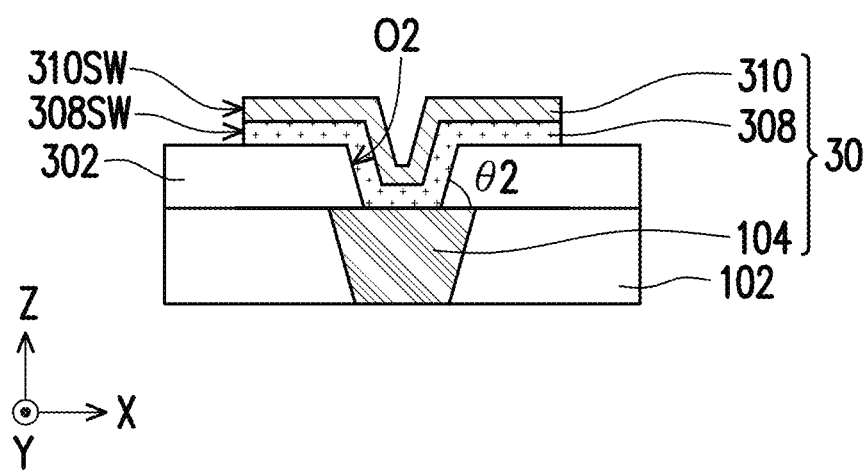

Referring to FIG. 12 and FIG. 13 together, in some embodiments, using the photoresist pattern PR3 as a mask, the conductive material 310m and the storage element material 308m are patterned to form a conductive layer 310 and a storage layer 308, respectively and sequentially. The patterning process is the same as or similar to the patterning process as described in FIG. 2 through FIG. 3, and thus is not repeated herein for brevity. In some embodiments, the storage layer 308 and the conductive layer 310 each have a sidewall (e.g., 308SW, 310SW in FIG. 13) substantially aligned to each other in the direction Z. For example, on the X-Y plane, a size of the conductive layer 310 and a size of the storage layer 308 are substantially the same to each other and are greater than the size of the electrode layer 104. For example, as shown in FIG. 13, a portion of the dielectric layer 302 is exposed by the conductive layer 310 and the storage layer 308.

In some embodiments, as shown in FIG. 13, a profile of the cross section of the storage layer 308 inside the recess O2 is in a form of V-shape. In other words, the included angle θ2 is between the storage layer 308 lied at the sidewall SW4 of the recess O2 and the electrode layer 104 (or the dielectric layer 102) covered by the dielectric layer 302. For example, the included angle θ2 is approximately ranging from 30° to 75°. On the other hand, owing to the recess O1 and the V-shaped storage layer 308 located therein, a profile of the cross section of the conductive layer 310 inside the recess O2 is also in a form of V-shape, as shown in FIG. 13. In some embodiments, the storage layer 308 has a thickness of about 10 nm to about 30 nm. In some embodiments, the conductive layer 310 has a thickness of about 20 nm to about 50 nm. The material of the storage layer 308 is different from the material of the selector 116, for example.

The electrode layer 104, the storage layer 308 and the conductive layer 310 together constitute a memory element 30, in some embodiments. For example, as shown in FIG. 13, the memory element 30 is a MIM structure and is referred to as an RRAM device, where the electrode layer 104 is referred to as a bottom electrode of the RRAM device and the conductive layer 310 is referred to as a top electrode of the RRAM device. In addition, the memory element 30 further includes the adhesive layer between the conductive layer 310 and the storage layer 308, where the adhesive layer is also patterned to have a sidewall substantially aligned with the sidewall 310SW of the conductive layer 310 and the sidewall 308SW of the storage layer 308.

Figure 14:
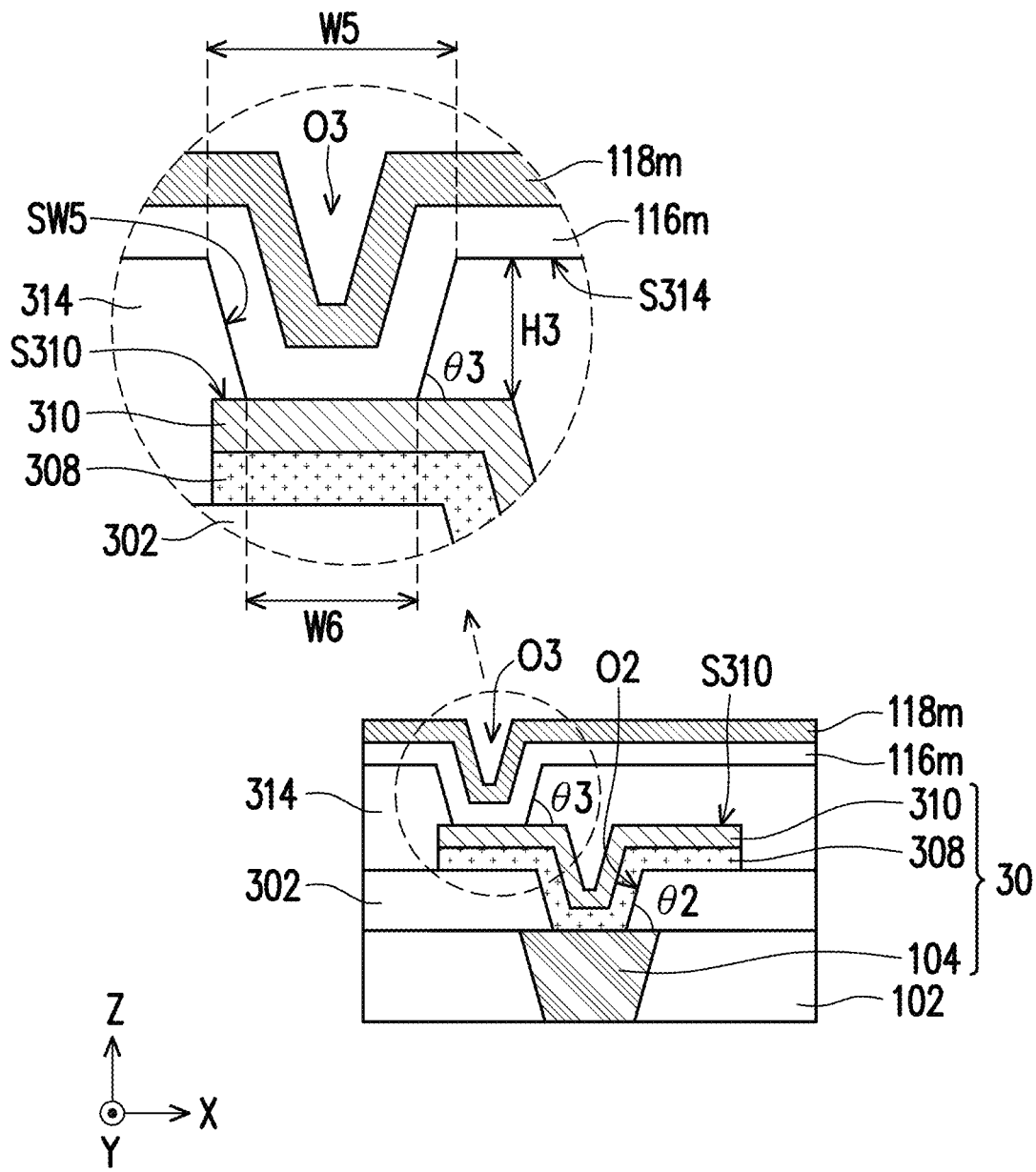

Referring to FIG. 14, in some embodiments, a dielectric layer 314 is formed on the dielectric layer 302 and covers the memory element 30 (e.g., the storage layer 308 and the conductive layer 310 included therein). For example, the dielectric layer 314 has a recess (also referred to as a "via hole" or "trench") O3 exposing the conductive layer 310 of the memory element 30. The formation and material of the dielectric layer 314 are the same as or similar to the formation and material of the dielectric layer 114 as described in FIG. 4 through FIG. 5, and thus are not repeated herein. In some embodiments, the dielectric layer 314 serves as an insulating layer, which is referred to as an IMD layer. In the case of which the material of the dielectric layer 302 is identical to the material of the dielectric layer 314, there is no interface between the dielectric layer 302 and the dielectric layer 314. A sidewall SW5 of the recess O3 and a top surface S310 of the conductive layer 310 covered by (e.g. not exposed by) the dielectric layer 314 together confine an included angle θ3. For example, the included angle θ3 is approximately ranging from 30° to 75°. That is, the sidewall SW5 of the recess O3 is slant in reference with the direction Z, as shown in FIG. 14.

As illustrated in FIG. 14, for example, the recess O3 has a top opening having a diameter W5 and a bottom opening having a diameter W6, and the diameter W5 is greater than the diameter W6. In some embodiments, the diameter W5 is approximately ranging from 10 nm to 50 nm, and the diameter W6 is approximately ranging from 5 nm to 30 nm. For example, in FIG. 14, for the recess O3, the top opening having the diameter W5 is located at a surface S314 of the dielectric layer 314 and the bottom opening having the diameter W6 is located at the surface S310 of the conductive layer 310. In some embodiments, the recess O3 has a height H3 approximately ranging from 10 nm to 30 nm.

Thereafter, a selector material 116m and an electrode material 118m are sequentially and conformally formed on the dielectric layer 314 and further extend into the recess O3. For example, the selector material 116m is located between the dielectric layer 314 and the electrode material 118m and between the conductive layer 310 and the electrode material 118m. That is, a portion of the selector material 116m is in contact with the conductive layer 310 through the recess O3 formed in the dielectric layer 314, where the sidewall SW5 of the recess O3 is covered by the selector material 116m. In other words, a surface of the selector material 116m is in contact with the dielectric layer 314 at the sidewall SW5 of the recess O3. The details (e.g., the formation, material, thickness, configuration or the like) of the selector material 116m and the electrode material 118m have been described in FIG. 6, and thus are not repeated for brevity.

Figure 15:
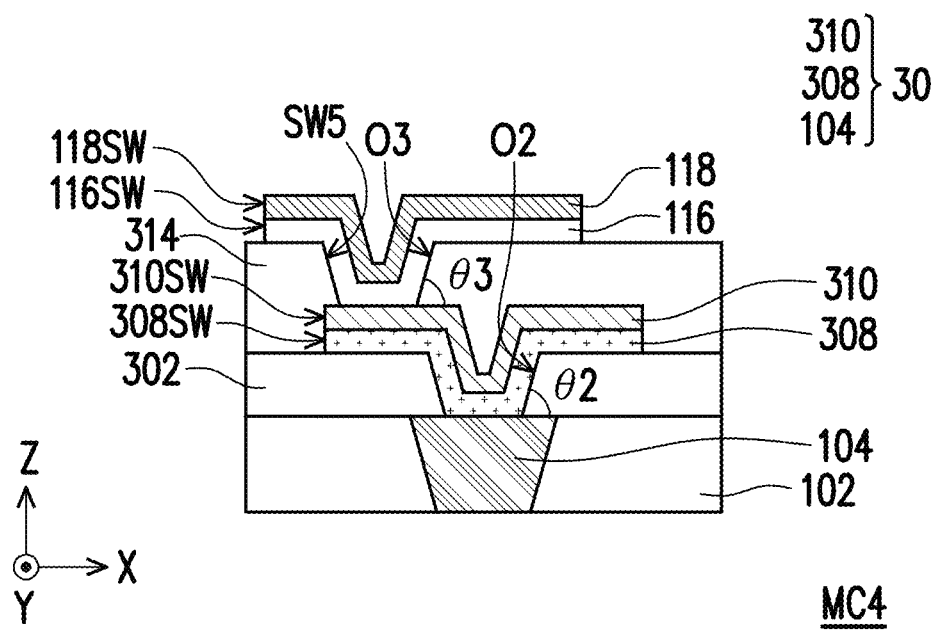
Figure 16:
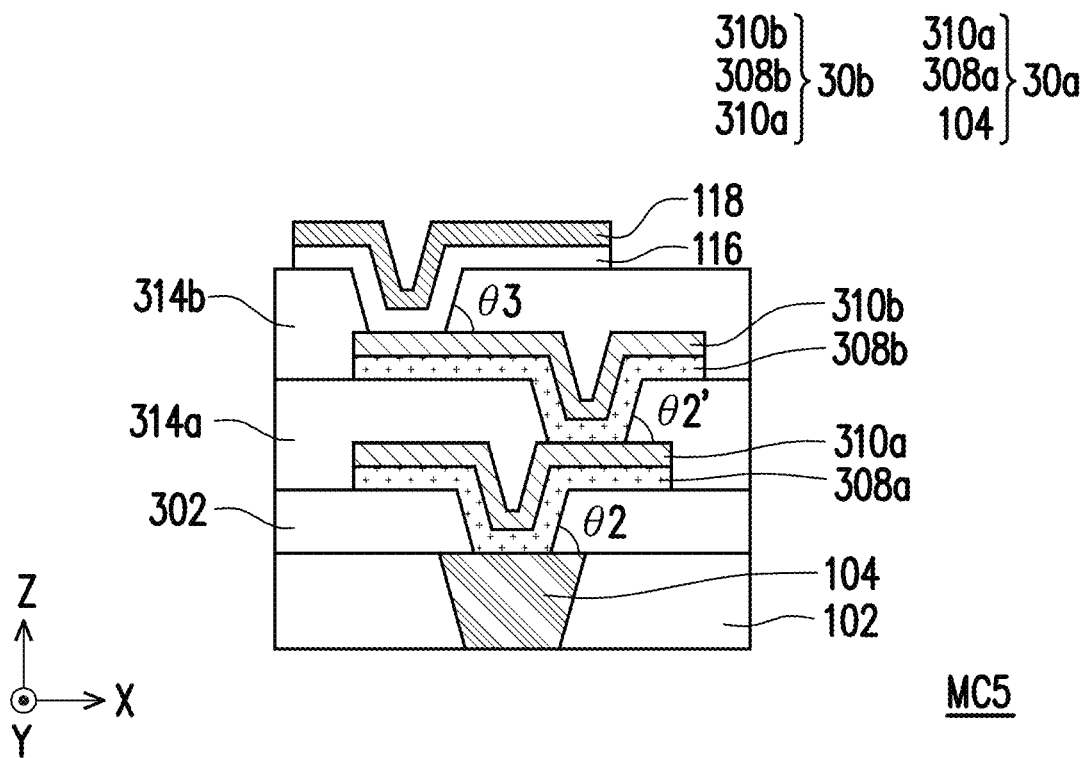
FIG. 16 is a cross-sectional view of a memory cell in accordance with some other embodiments of the disclosure.

Referring to FIG. 14 and FIG. 15 together, the electrode material 118m and the selector material 116m are patterned to form an electrode layer 118 and a selector 116, respectively and sequentially; thereby forming a selector 116 that is connected to the memory element 30. The patterning processes have been described in FIG. 6 through FIG. 8, and thus are not repeated herein. Up to here, the memory cell MC4 is manufactured, where in the memory cell MC4, the selector 116 is electrically coupled to the memory element 30. In some embodiments, the conductive layer 310 also serves as a connecting structure connecting the selector 116 and the conductive layer 310 to ensure the adhesion therebetween.

In some embodiments, the memory element 30 is in contact with and electrically connected to the selector 116 through the conductive layer 310 (which simultaneously serving the top electrode of the RRAM device (e.g. 30) and the connecting structure). That is, the memory element 30 is electrically coupled to the selector 116 in series. With such configuration, the voltage may be applied to the selector 116 for controlling the status (e.g. "on" or "off") of the memory element 30. While the memory element 30 is turned on, the voltages are further applied to the electrode layer 104 and the conductive layer 310 of the memory element 30 for operating the memory functions thereof (via HRS and LRS). The control mechanism of the selector 116 has been described in FIG. 6 while the operating principle of the memory element 30 is the same as the operating principle of the memory element 10 as described in FIG. 3, and thus are omitted herein for simplicity.

In some embodiments, the geometry of the electrode layer 118 is identical to the geometry of the selector 116 in the cross section depicted in FIG. 15 and the vertical projection on the X-Y plane in the direction Z. That is, the selector 116 and the electrode layer 118 each have a sidewall (e.g., 116SW, 118SW in FIG. 15) substantially aligned to each other along the direction Z. For example, on the X-Y plane, a size of the electrode layer 118 is substantially the same as a size of the selector 116. In some embodiments, a portion of the dielectric layer 314 is exposed by the selector 116. On the other hand, for example, the sidewall 116SW of the selector 116 and the sidewall 118SW of the electrode layer 118 are offset from the sidewall 310SW of the conductive layer 310 and the sidewall 308SW of the storage layer 308 in the direction Z. Alternatively, the sidewall 116SW of the selector 116 and the sidewall 118SW of the electrode layer 118 may be substantially aligned with the sidewall 310SW of the conductive layer 310 and the sidewall 308SW of the storage layer 308.

For example, as illustrated in FIG. 15, the selector 116 is located between and in contact with the conductive layer 310 and the electrode layer 118, where the selector 116 directly connects to the conductive layer 310 through the recess O3 formed in the dielectric layer 314. As shown in the cross section of FIG. 15, for example, the recess O3 formed in the dielectric layer 314 is formed in the shape of a trapezoid, where the diameter W5 of the top opening of the recess O3 is greater than the diameter W6 of the bottom opening of the recess O3. Owing to the recess O3, a profile of the cross section of the selector 116 inside the recess O3 is in a form of V-shape, as shown in FIG. 15. In other words, the included angle θ3 is between the selector 116 lied at the sidewall SW5 of the recess O3 and the conductive layer 310 covered by the dielectric layer 314. For example, the included angle θ3 is approximately ranging from 30° to 75°.

On the other hand, owing to the recess O3 and the V-shaped selector 116 located therein, a profile of the cross section of the electrode layer 118 inside the recess O3 is also in a form of V-shape, as shown in FIG. 15. Due to the selector 116 (e.g., its forming method and resulting structure), there is no conductive pillar between the selector 116 and the conductive layer 310, and the selector 116 is physically connected to the conductive layer 310 of the memory element 30; thereby greatly ensuring and securing the connection between the selector 116 and the memory element 30. Consequentially, due to the selector 116 (e.g. the omittance of the conductive pillar between the selector 116 and the conductive layer 310), the processing window of forming the memory cell MC4 is increased, thereby improving the manufacturing yield of the memory cell MC4 (e.g. the RRAM cell). Owing to the selector 116 (e.g., its forming method and resulting structure), the manufacture of the memory cell MC4 requests a low thermal budget, and thus the reliability of the memory cell MC4 is ensured.

In some embodiments, the memory cell MC4 has one selector 116 and one memory element 30. That is to say, the memory cell MC4 is implemented as a 1S1M configuration. However, the disclosure is not limited thereto; alternatively, the memory cell may include one selector 116 and a plurality of memory elements 30 electrically connected to the selector 116. In other words, the memory cell of the disclosure may be implemented as a 1S2M configuration (e.g., the memory cell MC5 in FIG. 16), a 1S3M configuration, a 1S4M configuration, a 1S5M configuration, . . . , a 1SnM configuration, etc. It is appreciated that; n is a positive integer. It is appreciated that; n is a positive integer. In some other embodiments, the memory cell MC4 is implemented as a 1-selector-1-transitor-1-resistor (1S1T1R) configuration.

FIG. 16 is a cross-sectional view of a memory cell in accordance with some other embodiments of the disclosure. In some embodiments, the memory cell MC5 has the 1S2M configuration as shown in FIG. 16, where the memory cell MC5 includes one selector 116 and two memory elements 30 (e.g. 30a and 30b). The memory cell MC5 illustrated in FIG. 16 is similar to the memory cell MC4 illustrated in FIG. 15. Therefore, the same reference numerals are used to refer to the same or liked parts, and its detailed description will be omitted herein.

As illustrated in FIG. 9, in some embodiments, the memory element 30a includes an electrode layer 104, a conductive layer 310a and a storage layer 308a located therebetween, where the electrode layer 104 and the conductive layer 310a are respectively referred to as a bottom electrode and a top electrode of the memory element 30a. On other hand, the memory element 30b includes the conductive layer 310a, a conductive layer 310b and a storage layer 308b located therebetween, where the conductive layer 310a and the conductive layer 310b are respectively referred to as a bottom electrode and a top electrode of the memory element 30b. The conductive layer 310a is commonly shared by the memory elements 30a and 30b. As shown in FIG. 16, for example, the selector 116 is connected to the conductive layer 310b, where the conductive layer 310b further serves as a connecting structure 112 connecting the selector 116 and the memory element 30b to ensure the adhesion therebetween.

In some embodiments, the memory element 30b is located between the selector 116 and the memory element 30a, where the memory element 30a is wrapped by the dielectric layers 102, 302a and 314a. The memory element 30b is wrapped by the dielectric layers 314a and 314b. As illustrated in FIG. 16, an included angle θ2 is between the storage layer 308a lied at a sidewall of the recess formed in the dielectric layer 302a and the electrode layer 104 covered by the dielectric layer 302a, and an included angle θ2' is between the storage layer 308b lied at a sidewall of the recess formed in the dielectric layer 314a and the conductive layer 310a covered by the dielectric layer 314a. The included angles θ2 and θ2' may be independently approximately ranging from 30° to 75°. The configurations of the recesses formed in the dielectric layer 302 and the dielectric layer 314a are identical to the configuration of the recess O2 formed in the dielectric layer 302 as described in FIG. 11, and thus are not repeated herein.

On the other hand, an included angle θ3 is between the selector 116 lied at a sidewall of the recess formed in the dielectric layer 314b and the conductive layer 310b covered by the dielectric layer 314b. The included angle θ3 may be approximately ranging from 30° to 75°. The configurations of the recess formed in the dielectric layer 314b is identical to the configuration of the recess O3 formed in the dielectric layer 314 as described in FIG. 14, and thus are not repeated herein.

In some embodiments, the selector 116, the memory element 30a and the memory element 30b are electrically coupled to each other in series. With such configuration, the memory elements 30a and 30b are simultaneously controlled by the selector 116. Owing to the selector 116 (e.g., its forming method and resulting structure (e.g. the included angle θ3 and the V-shape profile in the cross-section)), the connection between the selector 116 and the conductive layer 310b is greatly ensured and secured by direct contact, and there is no conductive pillar between the selector 116 and the conductive layer 310b. Consequentially, due to the selector 116 (e.g., the omittance of the conductive pillar between the selector 116 and the conductive layer 310b), the processing window of forming the memory cell MC5 is increased, thereby improving the manufacturing yield of the memory cell MC5 (e.g. the RRAM cell). Owing to the selector 116 (e.g., its forming method and resulting structure), a low thermal budget is requested, and thus the reliability of the memory cell MC5 is ensured.

Alternatively, the selector 116 may be electrically coupled to the memory element 30a and the memory element 30b in series, respectively, where the memory element 30a and the memory element 30b may be electrically coupled to each other in parallel. The formations and materials of the memory element 30a and the memory element 30b independently are the same as or similar to the formation and material of the memory element 30 as described in FIG. 11 through FIG. 15, the formations and materials of the dielectric layers 302a and 314/314b are respectively the same as or similar to the formations and materials of the dielectric layers 302 and 314 as respectively described in FIG. 11 and FIG. 14, and the details (e.g., the formation, material, thickness, configuration or the like) of the selector 116 and the electrode layer 118 have been described in FIG. 14 through FIG. 15, and thus are not repeated herein.

Figure 17:
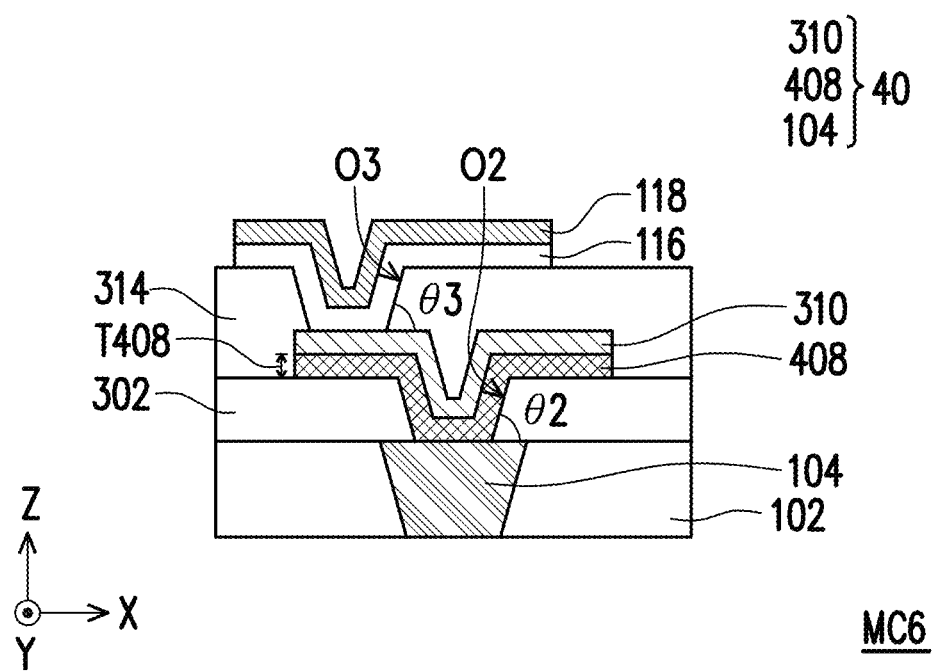
FIG. 17 is a cross-sectional view of a memory cell in accordance with some other embodiments of the disclosure.

FIG. 17 is a cross-sectional view of a memory cell in accordance with some other embodiments of the disclosure. The arrangement and material of the memory cell MC6 are similar to the arrangement and material of the memory cell MC4, and thus details thereof are omitted herein. A main difference between the memory cell MC6 depicted in FIG. 17 and the memory cell MC4 depicted in FIG. 15 lies in that the memory cell MC6 has a memory element 40 instead of the memory element 30. In some embodiments, the memory cell MC6 includes an electrode layer 104, a conductive layer 310 located on the electrode layer 104, and a storage layer 408 located between the electrode layer 104 and the conductive layer 310. The details (e.g., the formation, material, thickness, configuration or the like) of the electrode layer 104 and the conductive layer 310 have been described in FIG. 11 through FIG. 15, and thus are not repeated herein for brevity.

The material of the storage layer 408 is the same as or similar to the material of the storage layer 208 as described in FIG. 10 while the formation of the storage layer 408 is the same or similar to the formation of the storage layer 308 as described in FIG. 11 through FIG. 13, and thus are not repeated herein. The material of the storage layer 408 is different from the material of the selector 116, for example. The storage layer 408 may have a thickness T408 of about 5 nm to about 30 nm.

In some embodiments, the selector 116 is formed on and in contact with the memory element 40. As illustrated in FIG. 17, for example, the selector 116 is electrically coupled to the memory element 40 in series. With such configuration, the memory element 40 is controlled by the selector 116, where the voltage may be applied to the selector 116 for controlling the status (e.g. "on" or "off") of the memory element 40. While the memory element 40 is turned on, the current is applied to the memory element 40 for operating the memory functions thereof (via phase changes in the crystalline). The control mechanism of the selector 116 has been described in FIG. 6 while the operating principle of the memory element 40 is the same as the operating principle of the memory element 20 as described in FIG. 10, and thus are omitted herein for simplicity. In some embodiments, the electrode layer 104 may be referred to as a "heater" for the memory element 40.

Owing to the selector 116 (e.g., its forming method and resulting structure (e.g. the included angle θ3 and the V-shape profile in the cross-section)), the connection between the selector 116 and the conductive layer 310 is greatly ensured and secured by direct contact, and there is no conductive pillar between the selector 116 and the conductive layer 310. Consequentially, due to the selector 116 (e.g., the omittance of the conductive pillar between the selector 116 and the conductive layer 310), the processing window of forming the memory cell MC6 is increased, thereby improving the manufacturing yield of the memory cell MC6 (e.g.

the PCM cell). Owing to the selector 116 (e.g., its forming method and resulting structure), a low thermal budget is requested, and thus the reliability of the memory cell MC6 is ensured.

In addition, the memory element 40 may substitute at least one of the memory elements 20a and 20b included in the memory cell MC5.

In the disclosure, the selector 116 included in the memory cell MC1, MC2, MC30, MC4, MC5 or MC6, individually, may be electrically coupled to a plurality of memory elements, e.g. 10, 20, 30 and/or 40, in series. For example, a first group of the memory elements (10, 20, 30 and/or 40) are electrically connected to each other in series, and a second group of the memory elements (10, 20, 30 and/or 40) are electrically connected to each other in series. In one embodiment, the first group is electrically connected to the second group in series. In another embodiment, the first group is electrically connected to the second group in parallel. That is, in the first group and/or the second group, the memory elements may be electrically connected to each other, in the manner of, in parallel, in series, or partially in parallel and partially in series.

For example, the first group is different from the second group, e.g., in the memory element types (10, 20, 30, 40, or combinations thereof). The memory elements of the first group may include the RRAM of a single type (e.g., 10 or 30) or different types (e.g., 10 and 30) while the memory elements of the second group may include the PCM of a single type (e.g., 20 or 40) or different types (e.g., 20 and 40); or vice versa. Or, the memory elements of the first group may include the RRAM of a single type (e.g., 10 or 30) or different types (e.g., 10 and 30) while the memory elements of the second group may include the RRAM of a single type (e.g., 10 or 30) or different types (e.g., 10 and 30) and the PCM of a single type (e.g., 20 or 40) or different types (e.g., 20 and 40); or vice versa. Yet, the memory elements of the first group may include the PCM of a single type (e.g., 20 or 40) or different types (e.g., 20 and 40) while the memory elements of the second group may include the RRAM of a single type (e.g., 10 or 30) or different types (e.g., 10 and 30) and the PCM of a single type (e.g., 20 or 40) or different types (e.g., 20 and 40); or vice versa. Alternatively, the memory elements of the first group may include the RRAM of a single type (e.g., 10 or 30) or different types (e.g., 10 and 30) and the PCM of a single type (e.g., 20 or 40) or different types (e.g., 20 and 40) while the memory elements of the second group may include the RRAM of a single type (e.g., 10 or 30) or different types (e.g., 10 and 30) and the PCM of a single type (e.g., 20 or 40) or different types (e.g., 20 and 40); or vice versa. The disclosure is not limited thereto.

FIG. 18 is a cross-sectional view of a semiconductor device having a memory cell in accordance with some embodiments of the disclosure. The memory cell illustrated in the following embodiments is applied to, but not limited thereto, a RRAM cell. The structures, materials, and processes may be similar to what are shown in, and discussed referring to, FIG. 1 through FIG. 8. The details are thus no repeated herein. It is noted that other memory cells MC2, MC3, MC4, MC5 and MC6 may individually substitute the memory cell MC1 to form the semiconductor device of the example.

Referring to FIG. 18, a semiconductor device 1000 may include a substrate 500, a device region 502, the first interconnect structure 510, the memory cell MC1, and a second interconnect structure 520. In some embodiments, the substrate 500 is a semiconductor substrate, such as a bulk semiconductor, a semiconductor-on-insulator (SOI) substrate, or the like. The substrate 500 may be doped (e.g., with a p-type or an n-type dopant) or undoped. The substrate 500 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device region 502 is disposed on the substrate 500 in a front-end-of-line (FEOL) process. The device region 502 may include a wide variety of devices. In some alternative embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 102 includes a gate structure, source and drain regions, and isolation structures such as shallow trench isolation (STI) structures (not shown). In the device region 502, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 500. The functions of the devices may include memory, processors, sensors, amplifiers, power distribution, input/output circuitry, or the like.

As shown in FIG. 18, the first interconnect structure 510 is disposed on the device region 502, and the device region 502 is disposed between the substrate 500 and the first interconnect structure 510. In some embodiments, the first interconnect structure 510 includes a plurality of build-up layers (L1 to Lx-1, where x is a positive integer of 2 or greater) formed with insulating layers and conductive layers. In detail, the first interconnect structure 510 at least includes insulating layers 511, 513, 515, 517, conductive vias 512, 516, and conductive layers 514, 518. The conductive via 512 is disposed on and electrically connected to the device region 502. The conductive layer 514 is disposed on and electrically connected to the conductive via 512. The insulating layers 511, 513 are collectively referred to as an IMD layer laterally wrapping the conductive via 512 and the conductive layer 514 to constitute a build-up layer L1. On the other hand, the conductive layer 518 is disposed on and electrically connected to the conductive via 516. The insulating layers 515, 517 are collectively referred to as an IMD layer laterally wrapping the conductive via 516 and the conductive layer 518 to constitute another build-up layer Lx-1. As shown in FIG. 18, the build-up layer L1 is electrically connected to the build-up layer Lx-1 through other build-up layer(s) (not shown), for example. Alternatively, the build-up layer L1 may be electrically connected to the build-up layer Lx-1, directly.

The memory cell MC1 and the second interconnect structure 520 are stacked on the first interconnect structure 510 in order, along the direction Z (e.g., a build-up direction). The memory cell MC1 is disposed between and electrically connected the first interconnect structure 510 and the second interconnect structure 520. The second interconnect structure 520 may include an insulating layer 521 and a conductive layer 522. The insulating layer 521 is referred to as an IMD layer laterally wrapping the conductive layer 522 to constitute a build-up layer (not labelled) or a part of a build-up layer. The insulating layer 521 is disposed on the memory cell MC1 to cover the selector 116. The conductive layer 522 is disposed in a recess formed in the insulating layer 521 to electrically connect to the electrode layer 118 included in the memory cell MC1. That is, the electrode layer 104 of the memory cell MC1 is in contact with and electrically connected to the conductive layer 518 of the first interconnect structure 510, and the electrode layer 118 of the memory cell MC1 is in contact with and electrically connected to the conductive layer 522 of the second interconnect structure 520. The conductive layer 522 may provide the voltage to the selector 116 for control the status of the memory cell MC1 (e.g. turning "on" or "off" the memory element 10). On the other hand, the conductive layer 518 and the conductive layer 522 may provide the voltages to the memory element 10 of the memory cell MC1 for operating the memory functions thereof. It is noted that although the memory cell MC1 is illustrated in FIG. 8, the embodiments of the disclosure are not limited thereto. In other embodiments, one of the memory cells 20, 20a/20b, 30, 30a/30b and 40 are used to replace the memory cell MC1.

In some embodiments, the insulating layers 511, 513, 515, 517 and 521 are independently made of a dielectric material, such as silicon oxide, silicon nitride, silicon oxynitride, a spin-on dielectric material, or a low-k dielectric material. The conductive layers 214, 518 and 522 each may be a conductive trace/line/wire, and the conductive layers 214, 518 and 522 and the conductive vias 512 and 516 may independently include metals or metal alloys including one or more of Al, AlCu, Cu, Ti, TiN, W, or the like. The conductive layers 514, 518 and 522 and the conductive vias 512 and 516 are a portion of a current driving circuit (not shown) to provide voltages to the memory cell MC1. In some embodiments, the conductive via 512 and the conductive layer 514 are formed by a dual damascene process. That is, the conductive via 512 and the conductive layer 514 may be formed simultaneously. Similarly, the conductive via 516 and the conductive layer 518 may be formed by a dual damascene process. That is, the conductive via 516 and the conductive layer 518 may be formed simultaneously.

In some embodiments, the memory cell MC1 may be disposed between any two adjacent conductive layers in the back-end-of-line (BEOL) structure. In certain embodiments, the fabricating process of the memory cell MC1 may be compatible with the BEOL process of the semiconductor device, thereby simplifying process steps and efficiently improving the integration density.

In accordance with some embodiments, a memory cell includes a memory device, a connecting structure, an insulating layer and a selector. The connecting structure is disposed on and electrically connected to the memory device. The insulating layer covers the memory device and the connecting structure. The selector is located on and electrically connected to the memory device, where the selector is disposed on the insulating layer and connected to the connecting structure by penetrating through the insulating layer.

In accordance with some embodiments, a semiconductor device includes a first interconnect structure, a memory cell and a second interconnect structure. The first interconnect structure is disposed on a substrate. The memory cell is disposed on and electrically connected to the first interconnect structure, where the memory cell includes a memory device, a connecting structure, an insulating layer and a selector. The connecting structure is disposed on and electrically connected to the memory device. The insulating layer covers the memory device and the connecting structure. The selector is located on and electrically connected to the memory device, where the selector is disposed on the insulating layer and connected to the connecting structure by penetrating through the insulating layer. The second interconnect structure is disposed on the memory cell and electrically connected to the selector, where the memory cell is located between the first interconnect structure and the second interconnect structure.

In accordance with some embodiments, a method of manufacturing a memory cell includes the following steps: forming a memory device and a connecting structure located on the memory device; encapsulating the connecting structure and the memory device in a first insulating layer; patterning the first insulating layer to form a first recess exposing the connecting structure; disposing a selector material over the first insulating layer, the selector material extending into the first recess and connecting to the connecting structure; and patterning the selector material to form a selector being in contact with the connecting structure so as to form a selector located on and electrically connected to the memory device.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A memory cell, comprising:
   a memory device;
   a connecting structure, disposed on and electrically connected to the memory device;
   an insulating layer, covering the memory device and the connecting structure; and
   a selector, located on and electrically connected to the memory device, wherein the selector is disposed on the insulating layer and connected to the connecting structure by penetrating through the insulating layer.

2. The memory cell of claim 1, wherein the selector penetrates the insulating layer by locating in a recess formed in the insulating layer, and the recess exposes the connecting structure,
   an included angle is between the selector lied at a sidewall of the recess and the connecting structure covered by the insulating layer, wherein the included angle approximately ranging from 30° to 75°.

3. The memory cell of claim 2, wherein in a stacking direction of the memory device and the selector, a cross section of the selector located in the recess comprises a V-shape.

4. The memory cell of claim 1, further comprises:
   an upper electrode, disposed on the selector and over the insulating layer,
   wherein the selector is located between the upper electrode and the connecting structure, and a cross section of the upper electrode comprises a V-shape in a stacking direction of the memory device and the selector.

5. The memory cell of claim 4, wherein a sidewall of the upper electrode is substantially aligned with a sidewall of the selector.

6. The memory cell of claim 1, wherein a sidewall of the connecting structure is substantially aligned with a sidewall of the memory device.

7. The memory cell of the claim 1, wherein a material of the selector comprises an ovonic threshold switch material.

8. The memory cell of claim 1, wherein the memory device comprises:
 a bottom electrode;
 a top electrode, disposed on the bottom electrode; and
 a storage layer, disposed between the top electrode and the bottom electrode, wherein the top electrode is located between the storage layer and the connecting structure,
 wherein a sidewall of the bottom electrode is substantially aligned with a sidewall of the storage layer, a sidewall of the top electrode and a sidewall of the connecting structure, and
 wherein in a stacking direction of the memory device and the selector, a cross section of the bottom electrode, a cross section of the storage layer, a cross section of the top electrode and a cross section of the connecting structure comprise a strip-shape being substantially flat and planar to a plane perpendicular to the stacking direction.

9. The memory cell of claim 8, further comprising:
 a lower electrode, disposed on and electrically connected to the memory device, wherein the bottom electrode is located between the storage layer and the lower electrode.

10. The memory cell of claim 1, wherein the memory device comprises:
 a lower electrode;
 the connecting structure, disposed on the lower electrode; and
 a storage layer, disposed between the connecting structure and the lower electrode,
 wherein a sidewall of the connecting structure is substantially aligned with a sidewall of the storage layer,
 wherein in a stacking direction of the memory device and the selector, a cross section of the storage layer has a top surface having a first level height and a second level height, and the first level height is different from the second level height, and
 wherein in the stacking direction, the cross section of the storage layer comprises a V-shape, and a cross section of the connecting structure comprises a V-shape.

11. A semiconductor device, comprising:
 a first interconnect structure, disposed on a substrate;
 a memory cell, disposed on and electrically connected to the first interconnect structure, wherein the memory cell comprises:
  a memory device;
  a connecting structure, disposed on and electrically connected to the memory device;
  an insulating layer, covering the memory device and the connecting structure; and
  a selector, located on and electrically connected to the memory device, wherein the selector is disposed on the insulating layer and connected to the connecting structure by penetrating through the insulating layer; and
 a second interconnect structure, disposed on the memory cell and electrically connected to the selector, wherein the memory cell is located between the first interconnect structure and the second interconnect structure.

12. The semiconductor device of claim 11, wherein the memory cell comprises a plurality of memory cells, and the plurality of memory cells are electrically connected to the selector in series.

13. The semiconductor device of claim 11, wherein a portion of a top surface of the selector is lower than a top surface of the insulating layer.

14. The semiconductor device of claim 11, wherein the selector penetrates the insulating layer by locating in a recess formed in the insulating layer, and the recess exposes the connecting structure,
 an included angle is between the selector lied at a sidewall of the recess and the connecting structure covered by the insulating layer, wherein the included angle approximately ranging from 30° to 75°.

15. The semiconductor device of claim 14, wherein in a stacking direction of the memory device and the selector, a cross section of the selector located in the recess comprises a V-shape.

16. A method of manufacturing a memory cell, comprising:
 forming a memory device and a connecting structure located on the memory device;
 encapsulating the connecting structure and the memory device in a first insulating layer;
 patterning the first insulating layer to form a first recess exposing the connecting structure;
 disposing a selector material over the first insulating layer, the selector material extending into the first recess and connecting to the connecting structure; and
 patterning the selector material to form a selector being in contact with the connecting structure so as to form a selector located on and electrically connected to the memory device.

17. The method of claim 16, before patterning the selector material to form the selector and after disposing the selector material over the first insulating layer, wherein the method further comprising:
 disposing a first conductive material on the selector material; and
 patterning the first conductive material to form an upper electrode, the selector being located between the upper electrode and the connecting structure.

18. The method of claim 16, wherein forming the memory device and the connecting structure on the memory device comprises:
 providing a stack structure, the stack structure comprising a second conductive material, a third conductive material, a storage element material interposed between the second conductive material and the third conductive material, and a fourth conductive material disposing on the third conductive layer;
 patterning the fourth conductive material to form the connecting structure;
 patterning the third conductive material to form a top electrode;
 patterning the storage element material to form a storage layer; and
 patterning the second conductive material to form the bottom electrode, thereby forming the memory device having a metal-insulator-metal structure and constituted by the top electrode, the storage layer and the bottom electrode.

19. The method of claim 16, wherein forming the memory device and the connecting structure on the memory device comprises:
- forming a lower electrode;
- disposing a second insulating layer on the lower electrode, the second insulating layer comprising a second recess exposing the lower electrode;
- providing a stack structure on the second insulating layer, the stack structure further extending into the second recess and comprising a storage element material and a second conductive material located on the storage element material;
- patterning the second conductive material to form the connecting structure; and
- patterning the storage element material to form a storage layer, thereby forming the memory device having a metal-insulator-metal structure and constituted by the lower electrode, the storage layer and the connecting structure.

20. The method of claim 16, wherein patterning the selector material to form the selector being in contact with the connecting structure comprises:
- forming an included angle between the selector lied at a sidewall of the first recess and the connecting structure covered by the first insulating layer, wherein the included angle approximately ranging from 30° to 75°, and a cross section of the selector located in the first recess is formed in a form of a V-shape along a stacking direction of the memory device and the selector.

\* \* \* \* \*